US010060947B2

(12) United States Patent
Budach et al.

(10) Patent No.: US 10,060,947 B2
(45) Date of Patent: Aug. 28, 2018

(54) METHOD AND APPARATUS FOR ANALYZING AND FOR REMOVING A DEFECT OF AN EUV PHOTOMASK

(71) Applicant: Carl Zeiss SMT GmbH, Oberkochen (DE)

(72) Inventors: Michael Budach, Hanau (DE); Tristan Bret, Darmstadt (DE); Klaus Edinger, Lorsch (DE); Thorsten Hofmann, Rodgau (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/137,731

(22) Filed: Dec. 20, 2013

(65) Prior Publication Data

US 2014/0165236 A1 Jun. 12, 2014

Related U.S. Application Data

(63) Continuation of application No. PCT/EP2012/063881, filed on Jul. 16, 2012.
(Continued)

(30) Foreign Application Priority Data

Jul. 19, 2011 (DE) .......................... 10 2011 079 382

(51) Int. Cl.
*G01Q 30/02* (2010.01)
*G03F 1/22* (2012.01)
(Continued)

(52) U.S. Cl.
CPC .............. *G01Q 30/02* (2013.01); *B82Y 10/00* (2013.01); *B82Y 40/00* (2013.01); *G03F 1/22* (2013.01); *G03F 1/84* (2013.01); *G03F 1/86* (2013.01)

(58) Field of Classification Search
None
See application file for complete search history.

(56) References Cited

U.S. PATENT DOCUMENTS 4,709,383 A * 11/1987 Goto .................... G01N 23/20
378/71
6,235,434 B1 5/2001 Sweeney et al.
(Continued)

FOREIGN PATENT DOCUMENTS

CN 101592871 A 12/2009
JP 2002-532738 A 10/2002
(Continued)

OTHER PUBLICATIONS

Von C.H. Clifford, "Simulation and compensation methods for EUV lithography masks with buried defects," Univ. of California Berkeley, Tech. Report No. UCB/EECS-2010-62, http://www.eecs.berkeley.edu/Pubs/TechRpts/2010/EECS-2010-62.html.
(Continued)

*Primary Examiner* — Andrew Smyth
(74) *Attorney, Agent, or Firm* — Fish & Richardson P.C.

(57) ABSTRACT

The invention refers to a method for analyzing a defect of an optical element for the extreme ultra-violet wavelength range comprising at least one substrate and at least one multi-layer structure, the method comprising the steps: (a) determining first data by exposing the defect to ultra-violet radiation, (b) determining second data by scanning the defect with a scanning probe microscope, (c) determining third data by scanning the defect with a scanning particle microscope, and (d) com-bining the first, the second and the third data.

25 Claims, 12 Drawing Sheets

Related U.S. Application Data

(60) Provisional application No. 61/509,206, filed on Jul. 19, 2011.

(51) Int. Cl.
  G03F 1/84 (2012.01)
  G03F 1/86 (2012.01)
  B82Y 10/00 (2011.01)
  B82Y 40/00 (2011.01)

(56) References Cited

U.S. PATENT DOCUMENTS

| | | | |
|---|---|---|---|
| 7,230,695 B2 | 6/2007 | Ikuta et al. | |
| 7,623,620 B2 | 11/2009 | Mann et al. | |
| 8,142,958 B2 | 3/2012 | Holfeld | |
| 8,206,889 B2 | 6/2012 | Tanaka | |
| 2002/0051567 A1* | 5/2002 | Ganz | G03F 7/70483 382/152 |
| 2005/0201514 A1 | 9/2005 | Mann et al. | |
| 2006/0007433 A1 | 1/2006 | Ikuta et al. | |
| 2006/0154150 A1* | 7/2006 | Engel | G03F 1/72 430/4 |
| 2008/0318138 A1 | 12/2008 | Holfeld | |
| 2009/0107266 A1* | 4/2009 | Tella | G01O 70/02 73/866.5 |
| 2009/0297988 A1 | 12/2009 | Tanaka | |
| 2010/0019147 A1* | 1/2010 | Hatakeyama | G03F 1/86 250/307 |
| 2010/0124370 A1* | 5/2010 | Saito | G06K 9/4661 382/141 |
| 2010/0154521 A1 | 6/2010 | Budach | |
| 2010/0182589 A1* | 7/2010 | Hirose | G01J 3/02 356/51 |
| 2011/0239167 A1* | 9/2011 | Rathsack | G03F 7/705 716/50 |
| 2012/0307218 A1 | 12/2012 | Kamo | |

FOREIGN PATENT DOCUMENTS

| | | | |
|---|---|---|---|
| JP | 2003-133206 A | | 5/2003 |
| JP | 2003158063 A | * | 5/2003 |
| JP | 2003-228161 A | | 8/2003 |
| JP | 2004-287321 A | | 10/2004 |
| JP | 2005-525565 A | | 8/2005 |
| JP | 2005-532581 A | | 10/2005 |
| JP | 2007-147941 A | | 6/2007 |
| JP | 2008-506138 A | | 2/2008 |
| JP | 2009-010373 A | | 1/2009 |
| JP | 2009-290002 A | | 12/2009 |
| JP | 2011-517127 A | | 5/2011 |
| JP | 2011-108726 A | | 6/2011 |
| JP | 2011-249512 A | | 12/2011 |
| JP | 2012-248768 A | | 12/2012 |
| TW | 200706856 A | | 2/2007 |
| WO | WO 2004/015496 | | 2/2004 |
| WO | WO 2004015496 A2 | * | 2/2004 ............... G03F 1/74 |
| WO | WO 2004015496 A3 | * | 4/2005 ............... G03F 1/74 |
| WO | WO 2009/127368 | | 10/2009 |
| WO | WO 2010/072279 A | | 7/2010 |
| WO | WO 2011/161243 A1 | | 12/2011 |
| WO | WO 2011161243 A1 | * | 12/2011 ............. B82Y 10/00 |

OTHER PUBLICATIONS

Tsuneo Terasawa et al: "Actinic phase defect detection and printability analysis for patterned EUVL mask", SPIE Proceedings, vol. 7636, Mar. 1, 2010 (Mar. 1, 2010), pp. 763602-1-763602-10, XP002659237.

Sungmin Huh et al: "Study of Real Defects on EUV Blanks and a Strategy for EUV Mask Inspection", SPIE Proceedings vol. 7545, May 1, 2010 (May 1, 2010), pp. 75450N-1-75450N-8, XP002659236.

Waiblinger M et al: "E-beam induced EUV photomask repair—A perfect match", Feb. 3, 2010 (Feb. 3, 2010), Proceeoings of SPIE—vol. 7823, Nr. Part 1, pp. 75450P-1-75450P-8, XP055050034.

International Preliminary Report on Patentability for corresponding PCT Appl No. PCT/EP2012/063881, dated Jan. 21, 2014.

Japanese Office Action, with translation thereof, for JP Appl No. 2014-520624, dated Jan. 5, 2015.

Pang et al., "Compensation for EUV multilayer defects within arbitrary layouts by absorber pattern modification," Extreme Ultraviolet (EUV) Lithography II, edited by Bruno M. La Fontaine, Patrick P. Naulleau, Proc. of SPIE vol. 7969, 2011.

Kang et al., "Printability and inspectability of programmed pit defects on the masks in EUV lithography," Extreme Ultraviolet (EUV) Lithography, edited by Bruno M. La Fontaine, Proc. of SPIE vol. 7636, 2010.

Stearns et al., "Localized defects in multilayer coatings," Thin Solid Films 446 (2004) 37-49, 2003.

Van den Heuvel et al., "Natural EUV mask blank defects: evidence, timely detection, analysis and outlook," Photomask Technology Proc. of SPIE, vol. 7823, 2010.

Jonckheere et al., "Evidence of printing blank-related defects on EUV masks, missed by blank inspection," 27th European Mask and Lithography conference, Proc. of SPIE vol. 7985, 2011.

Clifford et al., "Compensation methods for buried defects in extreme ultraviolet lithography masks," J. Vac. Sic. Technol. B 29(1), Jan./Feb. 2011.

International Search Report for corresponding PCT Appl No. PCT/EP2012/063881, dated Jan. 31, 2013.

Chinese Office Action, with translation thereof, for CN Appl No. 201280035818.6, dated Dec. 22, 2015.

Taiwanese Office Action and Search Report, with translation thereof, for TW Appl No. 101124888, dated Jan. 22, 2016.

Japanese Office Action, with translation thereof, for corresponding JP Appl No. 2016-029117, dated Dec. 26, 2016.

Japanese office action, with translation thereof, for corresponding Appl No. 2016-029117, dated Sep. 4, 2017.

\* cited by examiner

Fig. 10
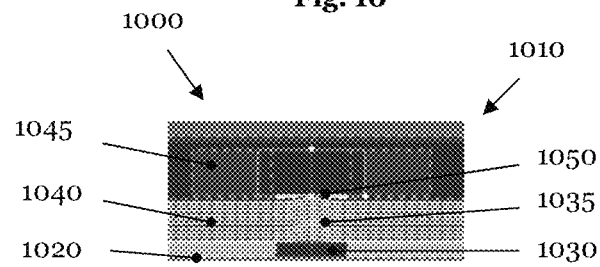
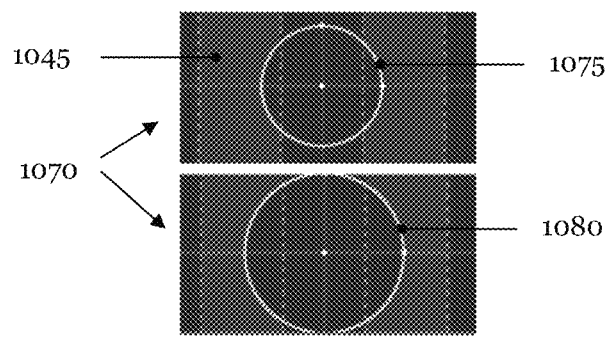
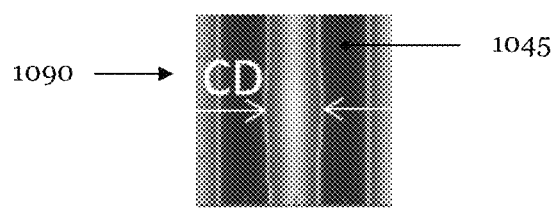

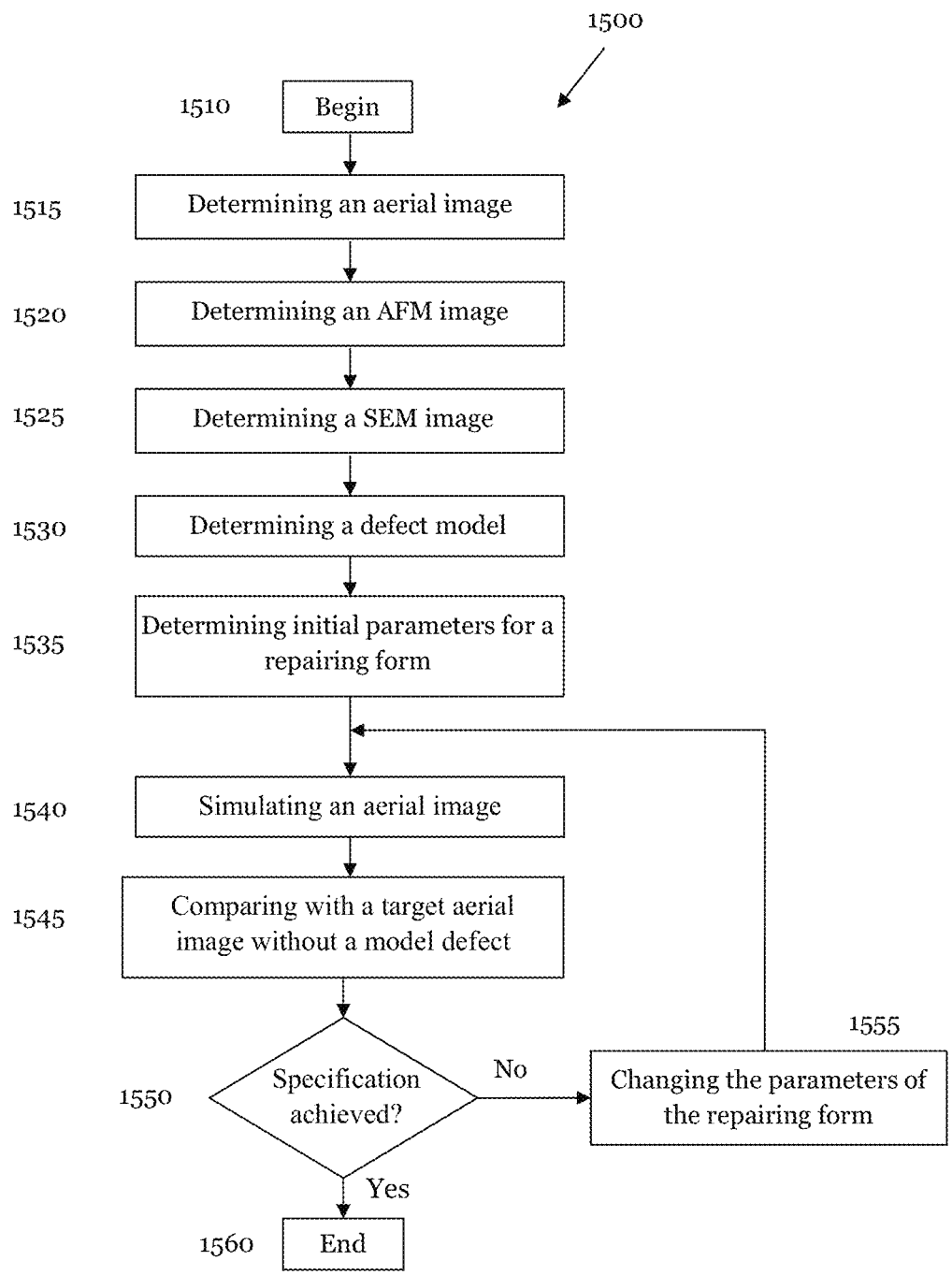

METHOD AND APPARATUS FOR ANALYZING AND FOR REMOVING A DEFECT OF AN EUV PHOTOMASK

CROSS-REFERENCE TO RELATED APPLICATIONS

The present application is a continuation of, and claims benefit under 35 USC 120 to, international application PCT/EP2012/063881, filed Jul. 16, 2012, which claims benefit under 35 USC 119 of German Application No. 10 2011 079 382.8, filed Jul. 19, 2011. International application PCT/EP2012/063881 also claims priority under 35 USC 119(e) to U.S. Provisional Application No. 61/509,206, filed Jul. 19, 2011. The entire disclosure of international application PCT/EP2012/063881 is incorporated by reference herein.

1. TECHNICAL FIELD

The present invention relates to the field of analyzing and removing a defect of an EUV photomask.

2. BACKGROUND OF THE INVENTION

As a result of the constantly increasing integration density in the semiconductor industry, photolithographic masks have to project smaller and smaller structures on wafers. In order to fulfill this demand, the exposure wavelength of lithography systems has been shifted to smaller and smaller wavelengths. In the future, lithography systems will use significantly smaller wavelengths in the extreme ultra-violet (EUV) wavelength range (preferably but not exclusively in the range of 10 nm to 15 nm). The EUV wavelength range presents enormous challenges to the precision of optical elements in the optical path of future lithography systems. These optical elements are probably reflective optical elements, since the refractive indexes of presently known materials are essentially one in the EUV range.

EUV mirrors comprise a substrate with a low thermal expansion as for example silica. A multi-layer structure comprising 40 to 60 double layers of silicon (Si) and molybdenum (Mo) is deposited on the substrate which acts as a dielectric mirror. Apart from the substrate and the multi-layer structure, EUV and photolithographic masks or simply EUV masks have additionally an absorber structure which is arranged on the multi-layer structure and which absorbs impinging EUV photons.

As a consequence of the extremely small wavelength already smallest unevenness of the multi-layer structure and minimal deviations of the absorber structure from the predetermined placement and/or of the predetermined target size of the structure elements of the absorber layer result in imaging errors of the wafers illuminated with the EUV mask. Moreover, defects in or on the substrate and/or in the multi-layer structure of the EUV mirror or the EUV mask also result in imaging errors of the structural elements which are imaged by the EUV mask on a wafer which cannot be tolerated. Defects in or on the substrate and/or in the multi-layer structure are in the following called buried defects.

The obvious approach for removing a buried defect would be to remove in a first step the multi-layer structure above the defect and to remove in a second step the uncovered defect and then deposit in a final step the part of the removed multi-layer structure. However, this process cannot be performed due to the multitude of layers of the multi-layer structure and their low thickness of approximately 3 nm for the molybdenum (Mo) layers as well as of approximately 4 nm for the silicon (Si) layers and the high demands on the planarity of the layers or their surfaces.

Rather the U.S. Pat. No. 6,235,434 B1 discloses a method for compensating the amplitude portion of a buried defect by the modification of the absorber structure of an EUV mask close to the buried defect. This process is in the following called "compensational repair" or compensation. FIG. 1 schematically represents its mode of operation. A local decrease of the reflectivity of the surface distorted by the buried defect is compensated by removing portions of the absorber material of neighboring absorber elements.

The above mentioned patent describes that not the geometrical size of the buried defect is compensated, but its equivalent size. The equivalent size of a buried defect depends on its position relative to neighboring absorber elements and the farer the distance is between the defect and the closest absorber element. Phase defects have a smaller equivalent area than amplitude defects. The position and the equivalent size of reflection distortions induced by defects can be determined by a characterization technique as for example photolithographic printing.

The thesis "Simulation compensation methods for EUV lithography masks with buried defects" of C. H. Clifford, University of California, Berkeley, Tech Report No. UCB/EECS-2010-62, http://www.eecs.berkely.edu/Pubs/TechRpts/2010/EECS-21010-62.html proposes two methods to reduce the effects of buried defects when a wafer is exposed. The first method uses pre-estimated design curves in order to determine a modification of the absorber structure solely on the basis of the CD (critical dimension) change induced by the defect. In order to convert the phase error of a buried defect in an amplitude error which can more easily be corrected, and thus reducing the effect of the defect when changing the focus conditions, the second method proposes to cover the defect with absorber material in order to block the light which is reflected from the region of the multi-layer structure distorted by the defect.

The article "Compensation of EUV Multi-layer Defects within Arbitrary Layouts by Absorber Pattern Modification" of L. Pang et al., SPIE Proc. 7969, 79691E (2011) describes the determination of a repairing form for buried defects. The surface contour of the defect is scanned with a scanning force microscope (AFM, Atomic Force Microscope). Using a growth model, the structure of the defect is determined within the multi-layer structure. An aerial image of the defective EUV mask is simulated and the result is compared with the aerial image without defect. The repairing form for the "compensational repair" of the defect is determined pixel by pixel from the comparison.

Another essential aspect of the effective removal of a buried defect is the position of the apparatus used for the defect removal with respect to the localized defect. The repairing can aggravate the negative effects of the buried defect if the position of the buried defect is not precisely taken into account at the defect compensation.

The present invention is therefore based on the problem to provide a method and an apparatus for analyzing a defect and for determining a repairing form of the defect which at least partially avoids the above mentioned drawbacks of the prior art.

3. SUMMARY OF THE INVENTION

According to a first aspect of the present invention this problem is solved by a method of claim 1. In one embodiment, the method for analyzing a defect of an optical element for an extreme ultra-violet wavelength range, which comprises at least one substrate and at least one multi-layer structure, comprises the steps: (a) determining first data by exposing the defect to ultra-violet radiation, (b) determining second data by scanning the defect with a scanning force microscope, (c) determining third data by scanning the defect with a scanning particle microscope, and (d) combining the first, the second and the third data.

In order to obtain as comprehensive information as possible about the buried defect, measuring methods are used which apply different measuring principles. Apart from photons at the actinic wavelength one uses a particle beam, in particular an electron beam as well as a scanning probe microscope to scan the defective area of the optical element.

By combining data which comes from three different data sources, i.e. which is determined by different measuring methods, it is possible to determine a comprehensive image of the defect of an optical element for the EUV wavelength range. Preferably, it is thus possible to directly compare the deviation which is generated by a buried defect at the surface of the multi-layer structure as well as its lateral extension with the effect on the imaging quality of the EUV mask at a wafer exposure. This is an essential prerequisite in order to be able to effectively compensate buried defects.

According to a further aspect exposing the defect with ultra-violet radiation comprises exposing the defect with extreme ultra-violet radiation, in particular with radiation of the actinic wavelength.

The shorter the exposure wavelength is selected, the more details of the defect are contained in the first data. On the other hand, the effort for the generation of suitable radiation sources increases with drastically with decreasing wavelength.

A further aspect comprises using of a scanning particle microscope for at least partially removing the defect.

A further aspect comprises generating at least one mark by locally depositing material on the multi-layer structure and/or on the absorber structure of the optical element and/or by etching a local indentation into the absorber structure.

Another aspect further comprises using a scanning particle microscope for arranging and/or for removing the at least one mark.

An EUV optical element as for example an EUV mirror does not have an absorber structure with which various measuring apparatuses can be aligned relative to each other. Therefore, one or several marks are preferably temporarily arranged on the surface of the multi-layer structure. In the case of an EUV mask, the absorber structure can be used as a mark for aligning the different measuring apparatuses. If the elements of the absorber structure are not sufficient or are not suitable, the explained method provides arranging one or several marks on the absorber structure and/or on the multi-layer structure. At the end of the repairing process, the mark(s) are again removed from the EUV mask or the EUV mirror.

By the combination of data which have been obtained with the help of three different measuring principles in combination with the arrangement of at least one mark, it can be secured that the defect repair occurs at the position of the EUV mask at which the buried defect is in fact localized.

Thus, the scanning particle microscope has several functions. Apart from analyzing a defect, it is preferably also used for generating a mark and for repairing the defect. This approach that the analysis device and the repairing tool can be integrated in one device. Thus, the execution of the overall process is facilitated.

In a further aspect combining the first, the second and the third data comprises compensating deviations with respect to the mark and/or with respect to a scale of the first data and/or the second data and/or the third data.

When compensating a deviation with respect to a certain mark and/or with respect to a scale, the three data of the data sources are combined in such a way that the information of the various data sources can be interrelated.

According to a further aspect combining the first, the second and the third data further comprises transforming at least the first and/or the second and/or the third data so that each pixel of the first data is associated with a pixel of the second data and a pixel of the third data.

When the pixels of the various data have a one-to-one (1:1) equivalence, the data of the various data sources can be combined in a single image. Thus, a maximum of information is obtained from the various data sources. In particular, the combined data can be input into a model in order to determine the parameters characterizing the defect. The preferred one-to-one equivalence of the various data which can also be used for aligning the repairing form makes sure that the repair of the defect occurs exactly at the position of the buried defect.

In another aspect exposing the defect with electromagnetic ultra-violet radiation further comprises recording at least one aerial image of the defect and/or exposing at least one wafer.

According to still another aspect recording the at least one aerial image of the defect comprises recording an aerial image in the focus and/or recording an aerial image stack by changing the focus relative to the optical element for the extreme ultra-violet wavelength range.

According to still another aspect, a scanning probe microscope comprises a scanning force microscope, a scanning tunneling microscope, a magnetic field force microscope, an optical near-field microscope, and a scanning near-field microscope, or a combination of these microscopes, and the scanning particle microscope comprises a scanning electron microscope, a focused ion beam microscope and/or an interferometer or a combination of these devices.

In still a further preferred aspect, the defect comprises a buried defect which is arranged in the multi-layer structure and/or in and/or on the substrate of the optical element.

The described method is preferably used for analyzing buried defects. However, the presented method can also be used for analyzing absorber defects. Moreover, the explained method can also be applied for analyzing defects of transmissive optical elements.

A further aspect comprises the step of adapting parameters of a model for at least one defect to the combined first, second and third data.

The model for the defect or the defect model uses the fact that defects which are accessible to an effective "compensational repair" have a similar surface contour. The multi-layer structure is deposited on the entire optical element in a single step. When the growth process of the multi-layer structure is finally adjusted all defects should have similar profiles. Even so these profiles are not known in detail, it can be assumed that all defects have the same cause, and therefore have a similar profile.

According to still a further beneficial aspect, the model for the defect comprises a rotational symmetrical Gaussian profile which is parameterized by a height and a full width at half maximum.

A visual buried defect has typically a certain height or depth of 3.5 nm. This corresponds to a quarter of the EUV wavelength of approximately 13.5 nm, and provides that the light reflected at the multi-layer structure has a phase shift of approximately ±. In practice, visual defects occur which have a height (or a depth) of several nm and a half width (FWHM) in the range of some 10 nm. Buried defects which are significantly shallower are only very restrictively visible. Defects which are laterally significantly more extended are only reparable to a limited extent via compensation or compensational repair due to a large area modification which is necessary on the absorber structure.

According to a further aspect, the model for the defect further comprises at least two parameters with respect to the position of the defect relative to the at least one mark.

The position, the height and the half width parameterize the model for the defect. These parameters can be determined from the combined first, second and third data.

A further aspect comprises placing the model for the defect so that the coverage of its half width (FWHM) is optimized using the second data.

According to a second aspect of the present invention, this problem is solved by a method according to claim 14. In one embodiment, the method for determining a repairing form comprises a least partially removing at least one defect of a photolithographic mask for the extreme ultra-violet wavelength range, having at least one substrate, at least one multi-layer structure and at least one absorber structure, comprises the steps: (a) analyzing the defect by one or several measuring methods, (b) determining a model of the at least one defect, and (c) determining the repairing form by using the model of the at least one defect.

The repairing form is adapted to the model of the defect. Due to the symmetry of the model of the defect, the repairing form resulting from this model is simple. Necessary calculations can be performed very rapidly. In particular, the resulting repairing form is intuitively understandable. Thus, the influence of the individual process parameters can be simulated independently from each other, and therefore their effects for different absorber structure can be analyzed. Further, the repairing form allows an evolutionary further development by the introduction of further parameters when systematic deviations occur.

Moreover, it is beneficial for the acceptance of the analysis and repairing method if the user can understand and/or physically interpret the functioning of the method. Thus, when necessary, he can adapt the method to a specific situation. Solutions which are exclusively numerically base often have acceptance problems at the user side.

A further beneficial aspect further comprises using the repairing to the absorber structure of the photolithographic mask for the extreme ultra-violet wavelength range.

According to a further preferred aspect analyzing at least one defect comprises: (a) determining first data by exposing the defect to ultra-violet radiation, (b) determining second data by scanning the defect with a scanning probe microscope, and (c) determining third data by scanning the defect with a scanning particle microscope.

Still a further aspect comprises the step of combining the first, the second and the third data.

In still another aspect, the determined repairing form essentially comprises the rotational symmetry of the model for the least one defect. In another aspect, the repairing form has essentially the form of a cycle.

As already mentioned, the topography of most defects should have a rotational symmetry due to the fabrication process of the multi-layer structure. The rotational symmetry translates into the symmetry of the repairing form which is used for the compensation of the defects. The diffraction limitation of the imaging systems which acts as a low pass filter removes higher spatial frequency components.

A further aspect uses a perturbation approach for describing the repairing form, wherein a reference defect at a reference position determines a reference diameter at the reference position and wherein deviations of the defect from the reference defect and the reference position are described by perturbation quantities.

According to another aspect, the reference position is determined by the at least one mark. Apart from the reference defect, the reference diameter also depends on the absorber structure.

The described method has especially two beneficial aspects. As the defect analysis is based on a comprehensive measured data set, the defect as well as its repairing form can be determined with the help of a broad data basis. It is possible to adjust the defect relative to the repairing form by adjusting pixel by pixel the image data obtained from various data sources, so that the application of the repairing form onto the absorber structure gives a maximum compensation effect.

According to still another aspect, perturbation variables of the repairing form takes into account deviations of the defect from the model for the at least one defect and the reference position.

According to a further aspect, the repairing form comprises a correction variable which takes the kind of the modification of the absorber structure into account. In still another aspect, the correction variable comprises a reduction of the diameter of the repairing form if the at least partial removal of the defect comprises removal of material of the absorber structure.

The repairing form actually realized in the absorber structure is larger than the calculated repairing form due to scattering processes of the particle beam of the scanning particle microscope which is used for modifying the absorber structure. The correction variable takes this fact into account.

A further beneficial aspect comprises the step of determining parameters of the repairing form by varying individual parameters via simulation.

The parameters of the repairing form can be determined during the analysis of the defect by simulation. Design data of the absorber structure and/or parameters of the multi-layer structure can be used as input quantities for the simulation. Alternatively, the parameters or at least a portion of the parameters for various absorber structures can be simulated in advance and the result can be stored in a memory. If no design data are available for the absorber structure, the input data for the simulation can be determined via an optical photographic image of the absorber structure.

Yet another aspect further comprises: (a) determining the parameters of the repairing form by simulating an aerial image of the model for the at least one defect with the repairing form, and (b) comparing with the aerial image of a region of the absorber structure which is free from defects.

Still another aspect comprises determining of initial parameters of the repairing form from the combined first, second and third data. According to another aspect comparing in step (b) is effected via a predetermined critical dimension.

Another aspect further comprises determining the parameters of the repairing form by comparing the model of the defect with stored defect models and selection of parameters of the repairing form of the defect model which is closest to the model for the defect. According to still another aspect the comparing the model for the defect and the stored defect models is done using the first data and/or the second data. Another aspect further comprises determining the stored defect models from at least a series of programmed defects and determining the repairing forms associated with the defect models by simulation.

By generating and measuring a series of defined defects, the connection between the buried defects, its manifestation on the surface of the multi-layer system and its effect for the exposure of the wafer can be determined without any further model assumptions. The depth profile or the propagation of the buried defect in the multi-layer structure is explicitly considered at the determination of the parameters of the repairing form by comparing both measuring data sets, the data set determined from the aerial image stack and the data set determined from the surface contour of the stored aerial image stack and the associated surface contour with each other. Thus, the repairing form fixed for a defect is preferably based on a maximum of measurement data. The repairing form of a defect which is already known and investigated is associated with the analyzed defect.

Another aspect further comprises determining the parameters of the repairing form by comparing an aerial image simulated with the wafer repairing form with a target aerial image in a repetitive process.

According to still another aspect determining of a repairing form comprises the following steps: (a) simulating an aerial image of the model for the at least one defect of the repairing form, (b) comparing the simulated aerial image with an aerial image of a region of the absorber structure which is free of defects, (c) if the deviation of the simulated aerial image and the aerial image of the defect free region is smaller than a predetermined threshold, selecting the repairing form with the present parameters, and (d) if the deviation of the simulated aerial image and the aerial image of the defect free region is larger than a predetermined threshold, changing the parameters of the repairing form and repeating steps (a) to (c).

According to still a further aspect, the simulation of the aerial image takes place without an absorber structure. In still a further aspect, the simulation combines the absorber structure as transmission matrix with the defect.

In still another aspect, the simulation comprises various propagation variants of buried defects through the multi-layer structure. In another aspect, the simulation comprises buried defects of different height and/or lateral extension.

Apart from the parameters which fix the surface contour of the defect, the propagation of the buried defect within the multi-layer structure or its depth profile is decisive for the effect of the defect on incident EUV radiation.

Another aspect further comprises using the repairing form for at least a partial removal of the defect by modification of the absorber structure with the scanning particle microscope. Another aspect further comprises determining the parameters of the repairing form via at least one focus stack of aerial images of defect free EUV masks.

A further aspect for determining the repairing form comprises the steps: (a) analyzing the defect with one of the methods of the above described aspects, (b) determining a repairing form with one of the methods of the above represented aspects, and (c) removing the defect by applying the repairing form onto the absorber structure of the defect of the optical element.

Still another aspect comprises repetitive application of the method to a defect which has remained from a previous defect removal.

Another aspect further comprises analyzing a defect which has been remained from a previous defect removal with at least one data source of the first mentioned aspect, and removal of the remaining defect according to the features (b) and (c) of the at last indicated embodiment.

Generally, parameters of the defect model and the referred repairing form are calibrated such that a repeated defect removal for removing a defect rest remaining after a first defect removal is only very rarely necessary. However, as each defect is at the end unique, it cannot be expected that the defect removal is completely successful at the first attempt. Therefore, the described method can be designed as a repetitive method in order to suppress, if necessary, a remaining defect rest below a predetermined threshold in a second process step. A remaining defect rest can occur when too much absorber material has been removed at the first defect correction and/or when too little absorber material has been removed at the first defect correction. Moreover, a defect rest can occur if at the first attempt of the defect removal too much material has been removed from at least one position of absorber structure while too little absorber material has been removed from at least one other position of the absorber structure.

Another aspect comprises adapting the parameters of the repairing form to the defect remaining after a previous defect removal. Still another aspect comprises adjusting the parameters of the repairing form so that a non-circular repairing form is generated.

A reason for a deviation from an axial symmetry can be the imaging system for the ultra-violet radiation source. Complex aperture arrangements, so called DISAR arrangements reach better resolutions for structures with a certain symmetry (for example for vertical line stripe patterns) as these approaches only transmit diffracted light in one direction (for example horizontally through two 60° quadrants). This can lead to the requirement to slightly adjust the optimal repairing form in two directions. This adjustment depends on the exposure of the mask. Further lithography nodes in the EUV range will presumably have their own exposure settings (among other things the numerical aperture (NA) and the pupil diameter a). These settings represent a further parameter which has to be considered at the simulation of the repairing form. However, these exposure settings only change between various stepper generations. Typical values for the 40 nm and 32 nm lithography nodes are NA=0.25 and σ=0.5 (annular). The next generation will probably have values of NA=0.32 and σ=0.4-0.8 (DISAR).

If the method for the defect removal has to be used for a second time, the parameters of the repairing form are adjusted to the new situation. It may occur in this process that absorber material has to be removed or to be added only at one absorber element. The repairing form can have the parameters leading to a non-circular repairing form in order to perform such a process. It is a benefit of the described repairing form that it may flexibly be adjusted to the respective situation. Thereby, it is an advantage that the user can intuitively understand the action of a parameter modification. Moreover, if necessary, he can simulate the effect onto the absorber structure or on the wafer exposure prior to the actual application.

Another aspect comprises the adaptation of the repairing form if a systematic deviation and/or a redetermination of the parameters of the repairing form occurs.

Also the method for removing a defect is described in view of a buried defect on a reflective EUV mask; its application is not restricted to buried defects. Rather, the method also allows the compensation of defects of the absorber structure, in particular also for defects which are caused by particles embedded in the absorber structure. Further, its application is not restricted to reflective optical elements; defects of transmissive photolithographic masks can also be analyzed and removed with the described method.

According to still another preferred aspect, an apparatus for analyzing a defect of an optical element for the extreme ultra-violet wavelength range comprises: (a) at least one ultra-violet radiation source for determining first data of the defect, (b) at least one scanning probe microscope for determining second data of the defect, (c) at least one scanning particle microscope for determining third data of the defect, and (d) at least a combination unit which is adapted to combine the first, the second and the third data.

The ultra-violet radiation source, the scanning probe microscope, the scanning particle microscope and the combination unit can be integrated in a single apparatus. However, it is also possible to realize the various approaches for determining data as separate apparatuses which can in addition be arranged separated from each other and the combination unit. Furthermore, a partial integration of the various approaches for determining the data is also conceivable. The apparatus is not restricted to the analysis of defects in reflective optical elements; rather it can also be used for investigating and/or for removing defects in transmissive optical element.

According to a yet another aspect, the ultra-violet radiation source further comprises a charge-coupled device camera which is arranged in the beam path instead of a wafer. Finally, the apparatus further comprises a mechanism for performing one of the methods according to one of the above mentioned aspects.

4. DESCRIPTION OF THE FIGURES

In the following detailed description presently preferred execution examples of the invention are described with reference to the figures, wherein FIG. 1 schematically illustrates an example of a "compensational repair" of a buried defect;

Figure 1:
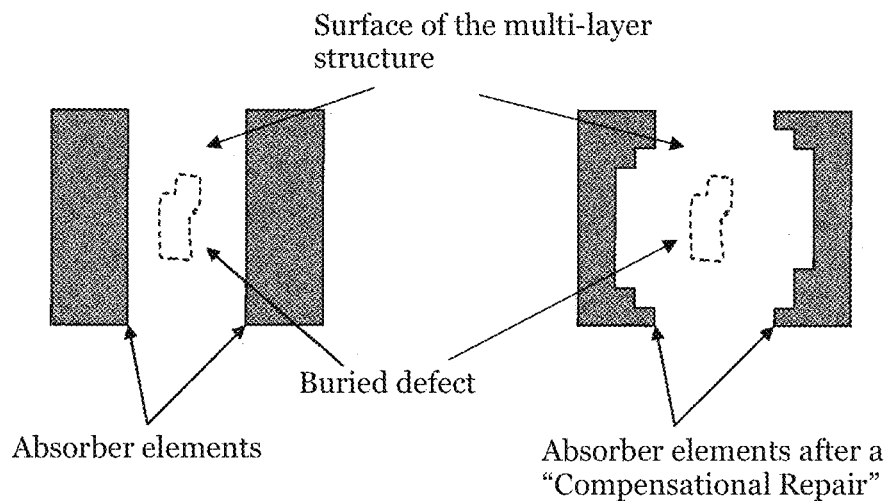
Figure 4:
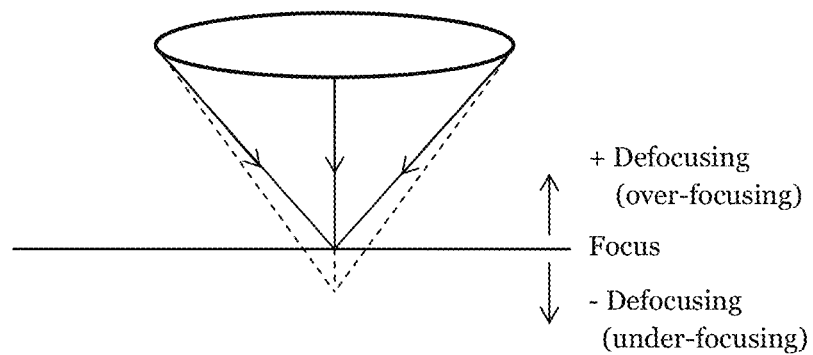
Figure 5:
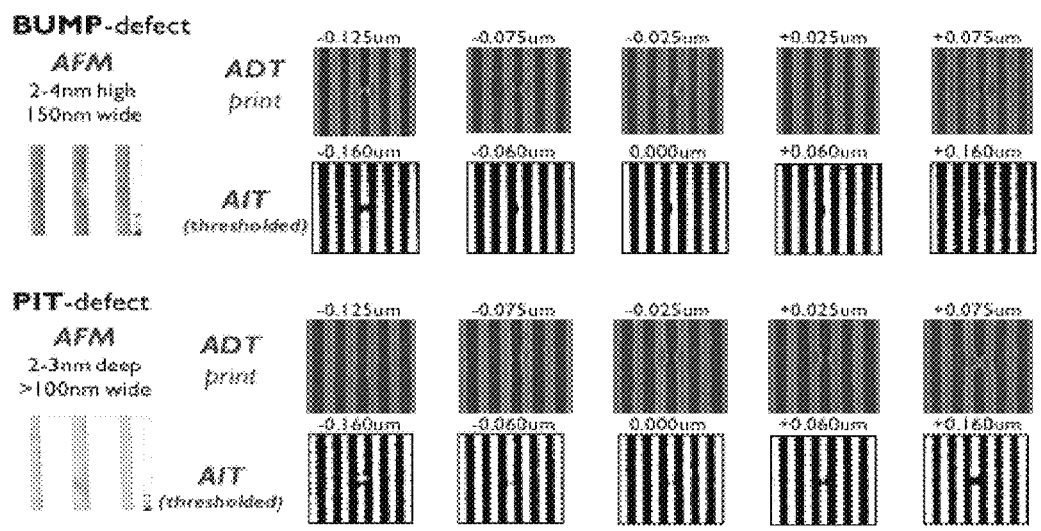
Figure 6:
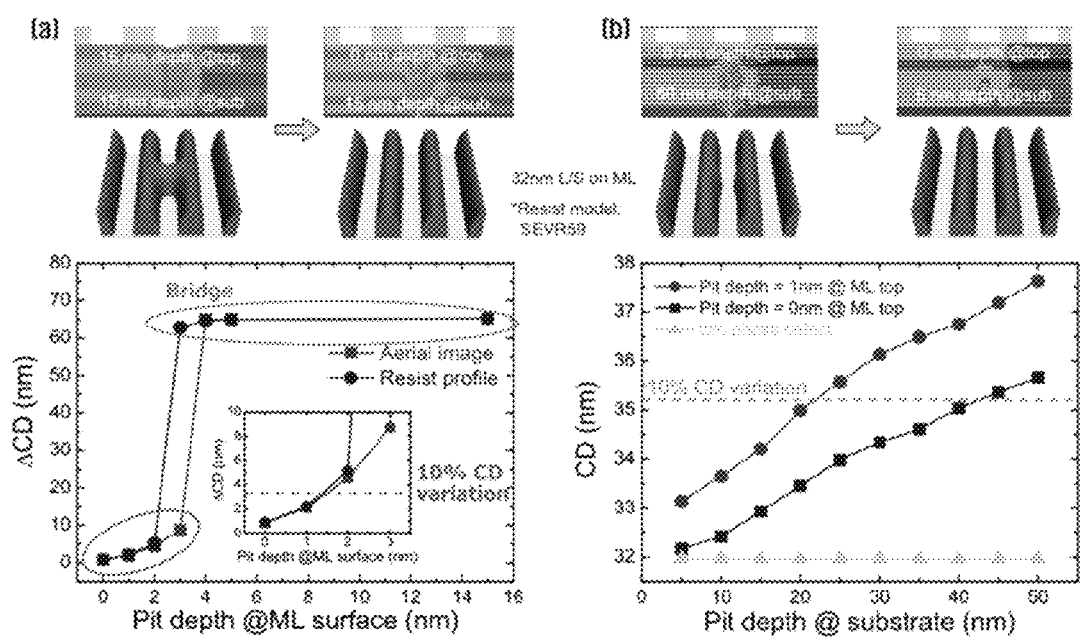
Figure 7:
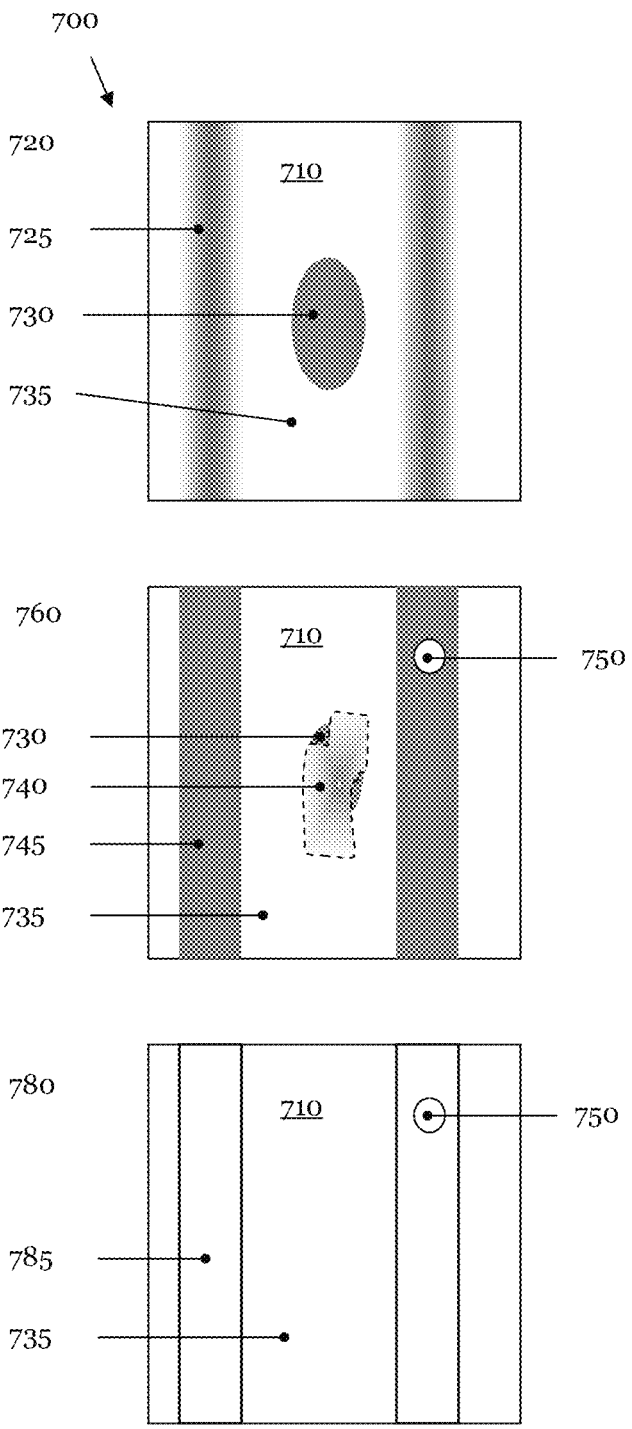
Figure 8:
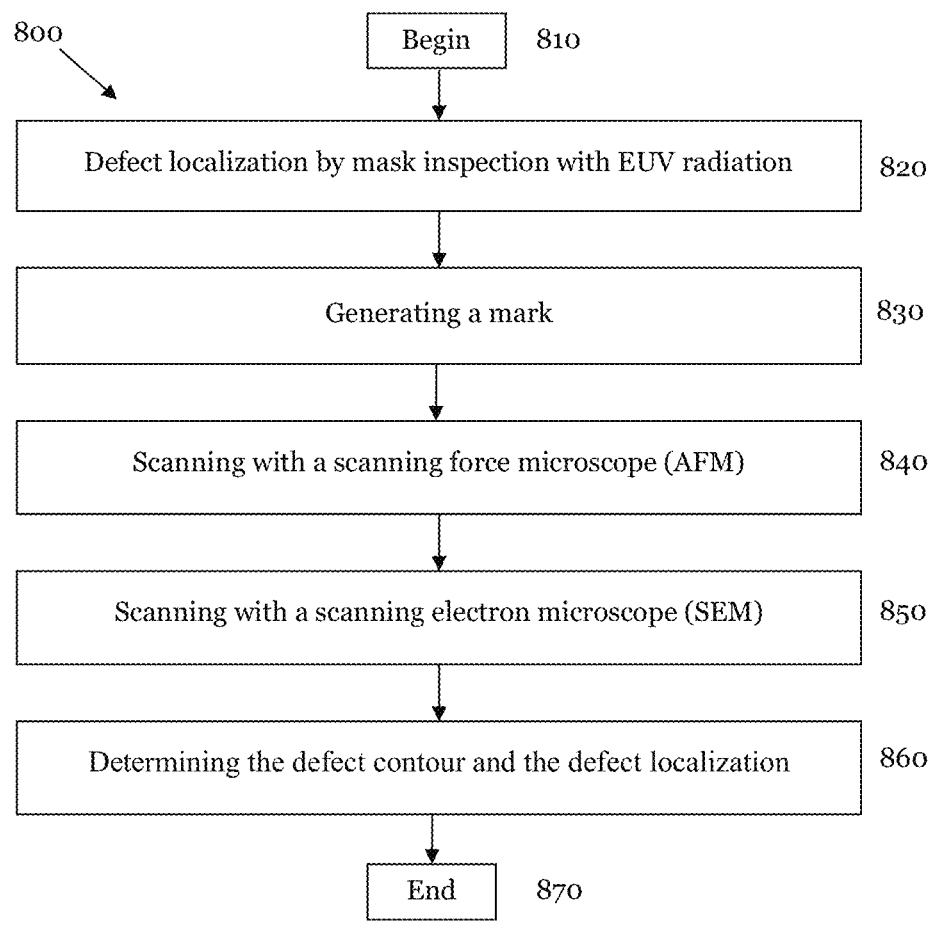
Figure 9:
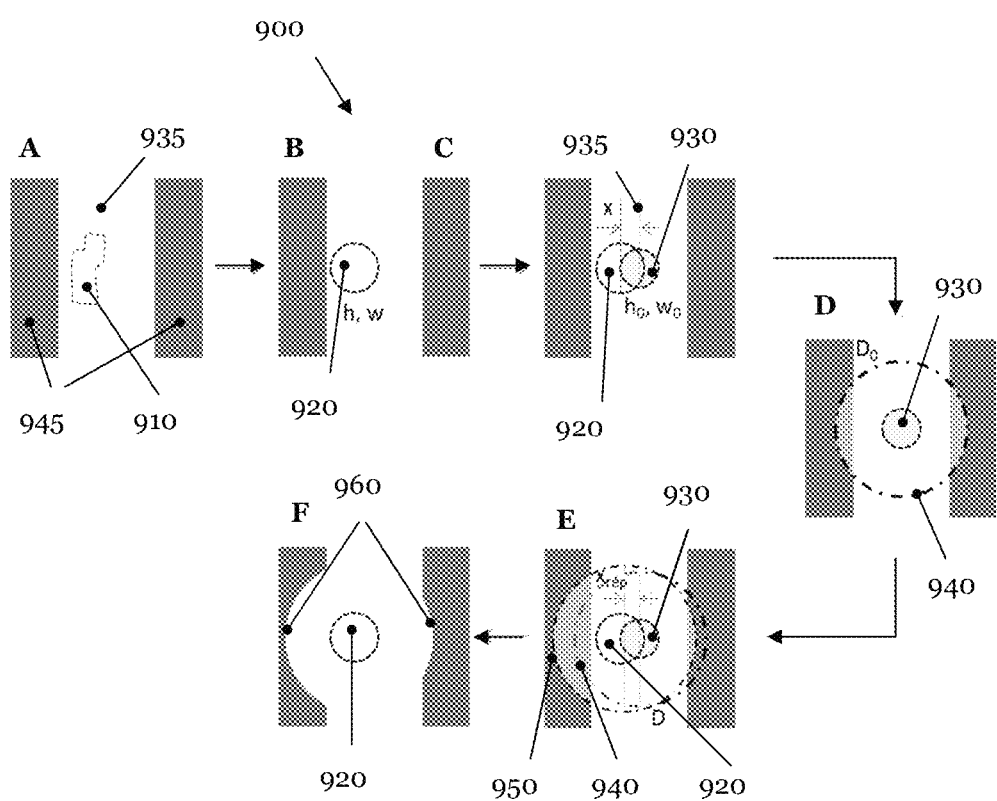
Figure 11:
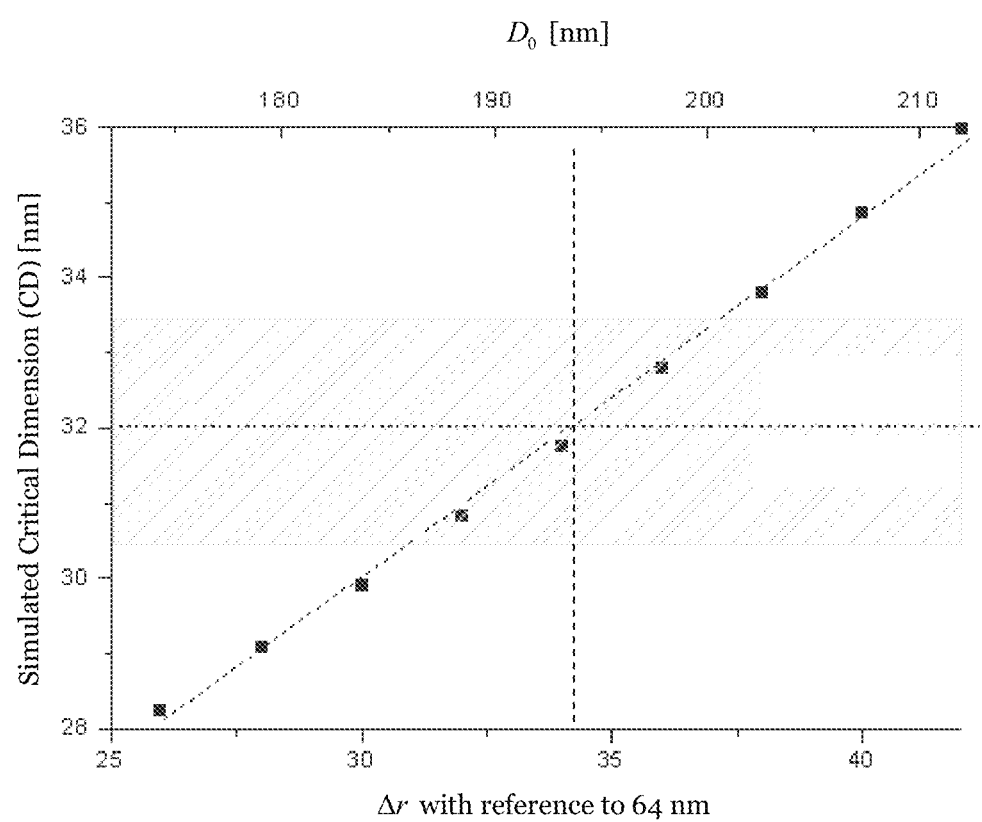
Figure 12:
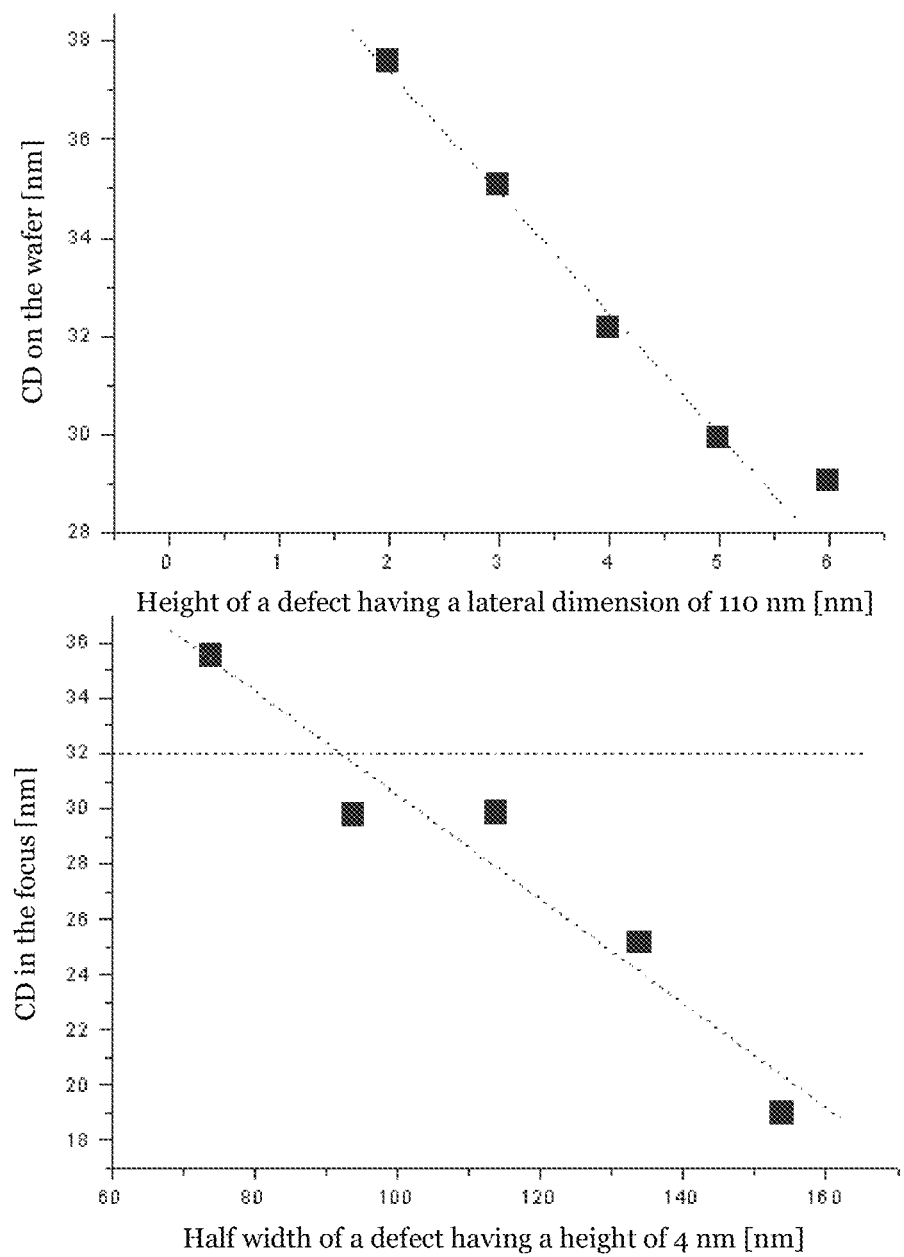
Figure 13:
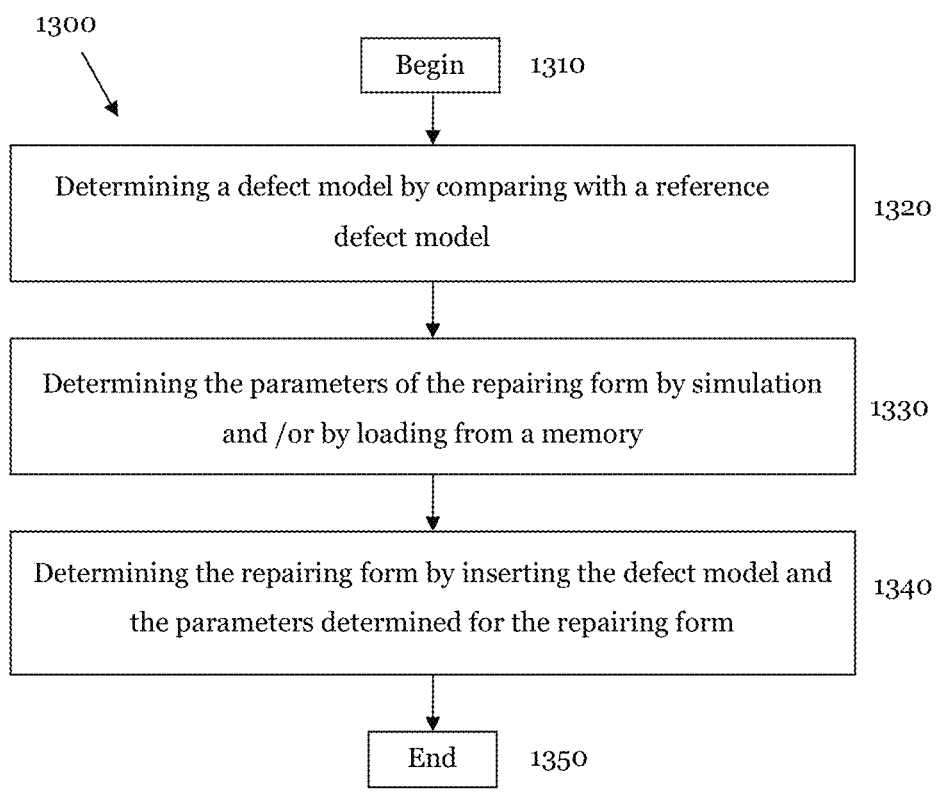
Figure 14:
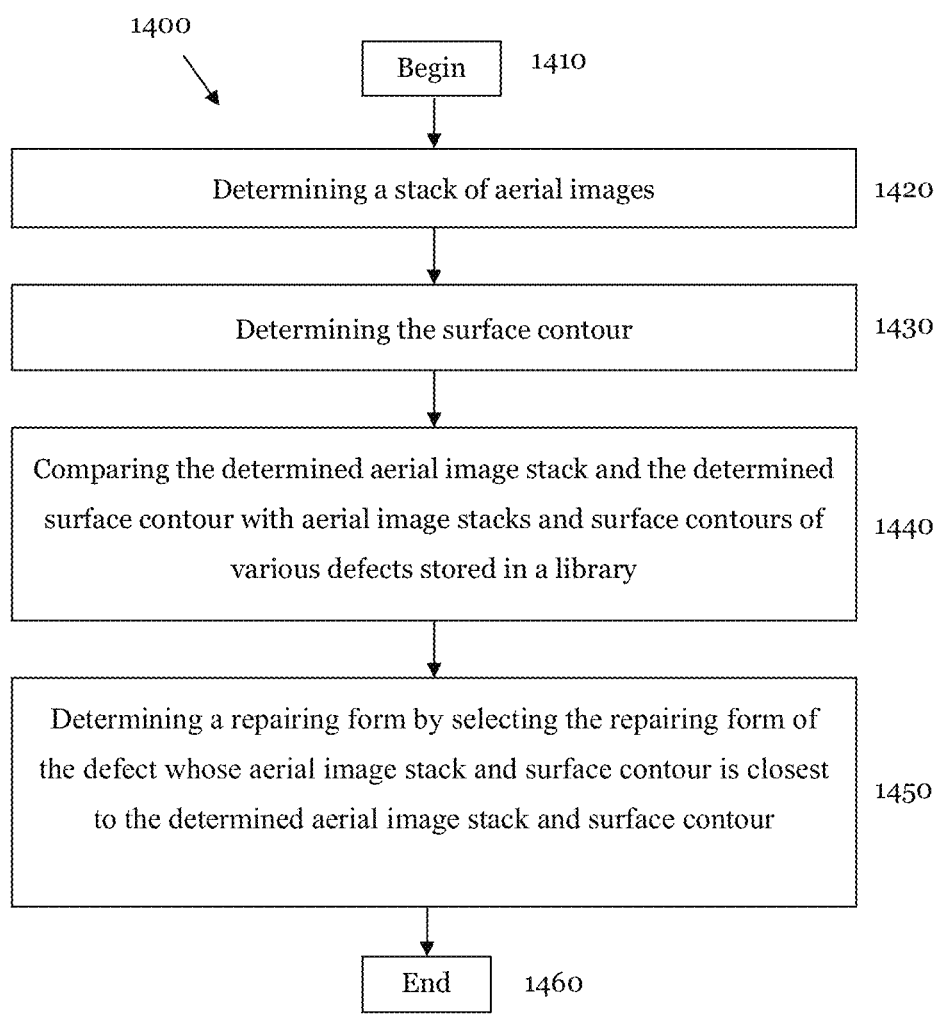

FIG. 4 schematically depicts the definition as a positive (+) defocusing (over-focusing) and a negative defocusing (under-focusing, dashed lines);

FIG. 5 presents on the left side AFM images of a bump defect (upper part) and of a pit defect (lower part), and presents on the right side a focus stack of aerial images (upper part) and of an exposed wafer (lower part) again with a bump defect (upper part) and a pit defect (lower part);

FIG. 6 represents simulated effects of various pit defects and the variation of their critical dimension;

FIG. 7 depicts schematic representations of images of a defect recorded with an AIMS® (upper part), an AFM (middle part), and an SEM (lower part);

FIG. 8 presents a schematic flow diagram for analyzing a buried defect;

FIG. 9 schematically illustrates the determination of the parameters of the defect model in the partial images A to C, and presents the effect of the parameters of a repairing form model in the partial images D to F;

FIG. 10 represents in the upper partial image a cross section for a buried defect, illustrates in the two middle images the effect of a repairing form, and the lower partial image represents the effect of the repairing form on the critical dimension (CD) of the absorber lines;

FIG. 11 presents the determination of the diameter of the repairing form model via a simulation process;

FIG. 12 presents the determination of two further parameters of the repairing form model according to FIG. 1;

FIG. 13 depicts a flow diagram of a concept for determining a repairing form;

FIG. 14 shows a flow diagram of an alternative concept for determining the repairing form; and FIG. 15 depicts a flow diagram of a further concept for the determination of the repairing form.

5. DETAILED DESCRIPTION OF PREFERRED EMBODIMENTS

Figure 2:
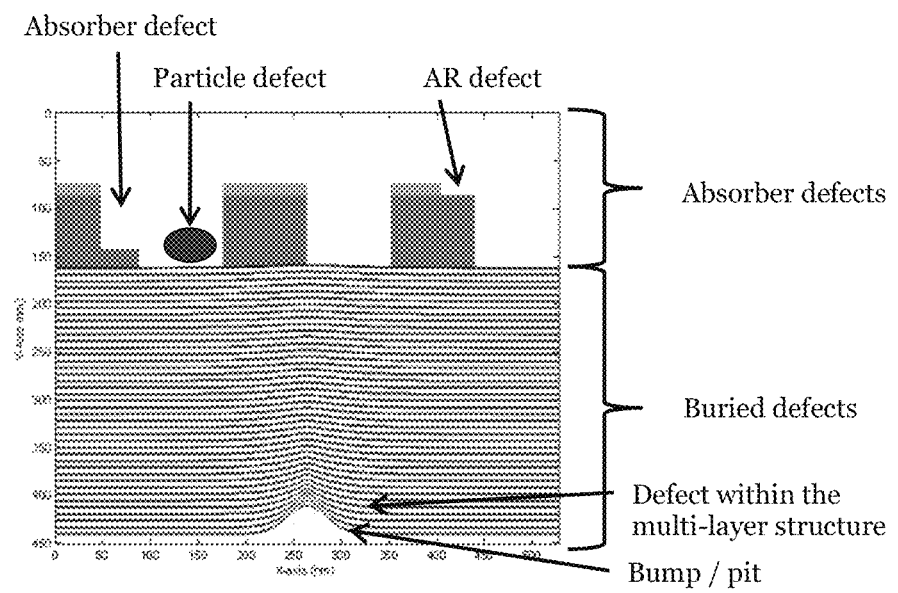
FIG. 2 illustrates a schematic overview of various defect types occurring in an EUV mask.

FIG. 2 gives an overview of the essential defect types of EUV masks. Absorber defects occur if absorber material is available at positions which have to be free from elements of the absorber structure. The inverse situation can also occur, i.e. the absorber material is completely or partially missing at positions which have to be covered with absorber elements. Moreover defects of the anti-reflection (AR) layer which is deposited on the absorber structure and/or dust or dirt particles on the surface of the multi-layer structure can also lead to absorber defects.

An absorber defect essentially causes an amplitude error in the reflected radiation. Typically, it can be visualized by scanning the EUV mask with a scanning electron microscope (SEM) and can be repaired with a mask repairing system, as for example a MeRiT™ system of the company Carl Zeiss. In this process missing absorber material is deposited by a local deposition process and excessive absorber material is removed by a local etching process.

Buried defects are on the one hand defects which have their origin within the multi-layer structure and are on the other hand defects which are localized in or on the substrate on which the multi-layer structure is arranged. Furthermore, they can also be arranged below an absorber element. Buried defects cause both amplitude errors and phase errors in the reflected EUV radiation. In contrast to amplitude errors, phase errors reverse the sign of their CD variation during passage of the focal plane through the surface of an EUV mask. Thereby, in contrast to amplitude errors, phase errors reduce the depth of focus of the image or the process window when exposing the wafer with an EUV mask.

Figure 3:
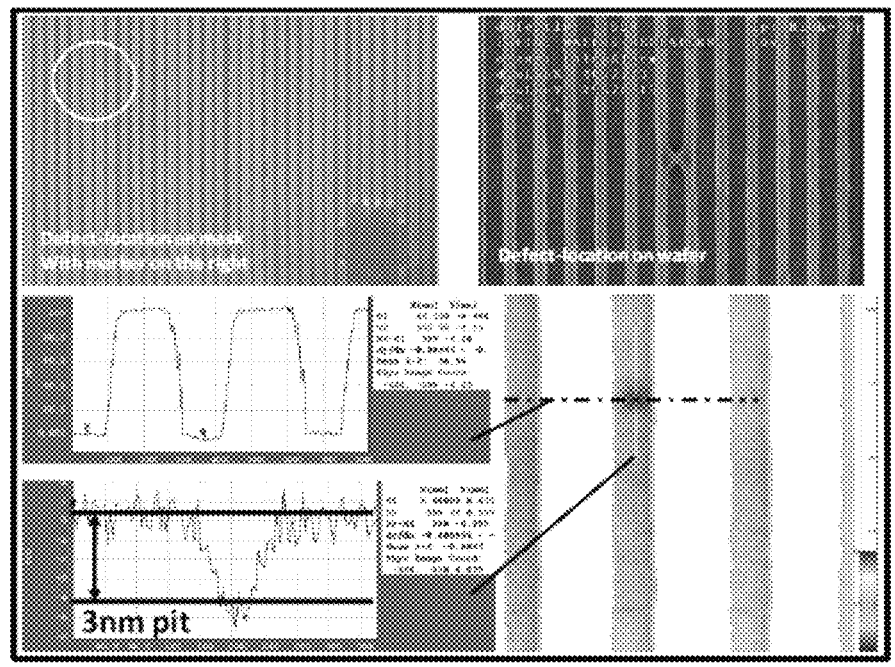
FIG. 3 shows a representation of a buried defect recorded with a scanning electron microscope (SEM) (upper left corner), an image of a wafer exposure (upper right corner), and an illustration obtained with a scanning force microscope (AFM) (lower part)

As it is indicated in the left upper partial image of FIG. 3, the buried defect can regularly not be detected with a scanning electron microscope. However, the buried defect clearly emerges on the wafer—as it is illustrated in the right upper partial image of FIG. 3—as an image defect of the EUV mask. Only by using a scanning force microscope (AFM) (lower partial image of FIG. 3) a small bump or a small depression can be detected which is typically caused by a buried defect at the surface of the multi-layer structure. FIG. 3 is taken from the publication "Natural EUV mask blank defects: evidence, timely detection, analysis and outlook" of D. Van den Heuvel et al., Proc. SPIE, vol. 7823 (2010).

Generally, buried defects can also be detected by a series of wafer exposures and/or by a series of aerial images. Thereby, the focus plane of the illumination system is systematically changed from above the EUV mask to below the EUV mask. FIG. 4 illustrates this interrelationship. A focus plane which is above the mask is called positive (+) defocusing or over-focusing; on the other hand, if the focus plane of the illumination system is within the mask itself as it is exemplarily represented by dashed lines in FIG. 4, this is called negative (−) defocusing or under-focusing.

The upper partial image of FIG. 5 shows an arching or a so called "bump defect" which is scanned with a scanning force microscope (AFM) in the left partial image. The right upper partial images represent images of a focus stack or a modification of the focus plane from an under-focusing to an over-focusing condition. The representations of the lower half image repeat the images for a small depression or a so called "pit defect" on the surface of the multi-layer structure. FIG. 5 is taken from the article "Evidence of printing blank-related defects on EUV masks missed by blank inspection" of R. Jonckheere et al., Proc. SPIE, vol. 7985 (2011).

FIG. 5 shows that archings or bump defects are more visible in both aerial images and also on wafers if the images have a negative defocusing or are "under-focused". Pit defects or small depressions on the surface of the multi-layer structure are more clearly visible with optical measuring methods preferably on the side of positive defocusing or at an "over-focusing" of the image when the focus plane is varied.

However, the detailed optical effects of buried defects cannot be detected via optical measurements of a stack of aerial images through the focus plane alone. Moreover, it is also not possible to simulate the effects of a buried defect as long as its topographic characteristics within the multi-layer structure and at the surface of the multi-layer structure are unknown. Thereby, the topographic characteristics at least comprise the height (for bump defects) or the depth (for pit defects), the lateral extension of the defect on the surface of the multi-layer structure, its position with respect to a reference point as well as its transmission or propagation through the multi-layer structure.

The surface of the multi-layer structure above a buried defect can be scanned via a scanning force microscope (AFM), and thus its surface contour can be determined. However, an image recorded with an AFM cannot provide information with respect to the propagation of the buried defect within the multi-layer structure.

The publication "Localized defects in multi-layer coatings" of D. G. Stearns et al., in Thin Film Solids 446 (2004), pages 37-49 describes a nonlinear model for the growth of a multi-layer structure whose layer growth is distorted by bump defects of various geometries. The investigations of these authors reveal that a buried defect which has a height modification of the surface of approximately 2 nm results in a critical error. The defect growth can be effectively suppressed by depositing the thicker Si layers and by partially removing in a subsequent eching step via an electron beam.

FIG. 6 illustrates that pit defects can propagate through the multi-layer structure in different ways. The partial image (a) shows a pit defect with a depth of 15 nm which propagates essentially unchanged through the multi-layer structure and can be seen in both the aerial image and in the photoresist on the wafer by a local melting of neighboring structure elements.

The partial image (b) of FIG. 6 illustrates that a buried pit defect which cannot be detected on the surface of the multi-layer structure as a depression leads to a variation of the CD. FIG. 6 is taken from the publication "Printability and inspectability of programmed pit defects on the masks in EUV lithography" of I.-Y. Kang et al., Proc. SPIE, vol. 7636, 76361B (2010).

In the following preferred embodiments of the inventive method and of inventive apparatuses are explained in more detail.

The diagrams 700 of FIG. 7 schematically show representations of a defect in a section of an EUV mask 710 as it appears in the image data or images of various data sources. The upper partial image 720 represents a top view of an aerial image of an oval defect 730 of the multi-layer structure 735. The defect is arranged between two vertical absorber lines 725 which are arranged on the multi-layer structure 735. The aerial image is taken with an AIMS® (Aerial Image Measurement System) provided by the company Carl Zeiss at the actinic wavelength, i.e. at 13.5 nm. An AIMS® is essentially an optical illumination system of a lithography apparatus which arranges a CCD (charge coupled device) camera at the position of the wafer in order to measure the aerial image generated by the EUV mask.

Instead of measuring an aerial image with an AIMS®, a wafer can also be exposed, and thus the defect can be determined on the exposed resist arranged on the wafer (not represented in FIG. 7). This alternative requires the usage of a wafer which can no longer be used for other purposes at least at the exposed position without having a larger correction effort. Therefore, the defect analysis by measuring an aerial image with an AIMS® is preferred. For defects 730 which are particularly difficult to identify, it may be beneficial to use both measuring methods in combination.

In the exemplary representation of the partial image 720 of FIG. 7, the detected defect 730 is a buried defect which is buried in the multi-layer structure 735 of an EUV mask 710. Further, in the partial image 720 as well as in the following diagrams, the absorber elements are vertical straight absorber lines 725 arranged in a regular distance. However, the application of the methods and apparatuses described in the present application are not restricted to this structure of an absorber pattern. Rather, this specific absorber structure has simply the purpose to illustrate the performance of the described methods and apparatuses.

After the defect 730 is localized by the analysis of the aerial image taken with an AIMS®, one or several marks 750 are generated close to the defect 730. It is the purpose of this mark or of these marks to facilitate or to enable the alignment of the further apparatuses used for analyzing and/or for removing the defect 730.

In the exemplary embodiment of FIG. 7, a mark 750 is generated on the absorber line 745 which is closest to the defect 730 by locally depositing material. However, it is also possible to generate one or several marks 750 on the multi-layer structure 735. It is also possible to generate a mark 750 on an absorber line 745 and to generate a further mark 750 on the multi-layer structure 735. Apart from locally depositing material, a mark 750 can also be formed by etching one or several local recesses in one or several absorber lines 745. Moreover, several marks 750 can be formed by a combination of local depositing material and by local etching of recesses in the absorber lines 745.

For example, a mark 750 can be generated by depositing material from a precursor gas, as for example dicobaltoctocarbonyl ($Co_2(CO)_8$) via a particle beam, i.e. via an electron beam and/or a focused ion beam. In order to etch a recess in an element of an absorber structure 745 for the generation of a mark 750, a particle beam can for example be used in combination with one or several etching gases (as for example xenon difluoride ($XeF_2$)). It is conceivable to use a combination of an electron beam and of an ion beam for both locally etching and locally depositing. The application of an electron beam is preferably compared to the application of an ion beam, since electron beams typically cause less damage in radiated materials than ion beams. A mask repairing device, as for example the MeRiT® system provided by the company Carl Zeiss can be used for generating a mark 750.

The middle partial image 760 of FIG. 7 presents a scan of an AFM (Atomic Force Microscope) across the region in which the defect 730 has been localized by the AIMS®. Thereby, on the one hand, the mark 750 is used for finding the defect 730 on the UV mask 710, and, on the other hand, the mark 750 is used for determining the region of the multi-layer structure 735 which is to be scanned with the AFM in order to cover the defect 730. The AFM is able to analyze the precise surface contour of the defect 740, since its resolution again surpasses the resolution of the AIMS® and can reach into the sub-nanometer range. For illustration purposes, the partial image 760 again highlights the defect 730 recorded with the AIMS®. The absorber lines 745 in the partial image 760 are sharper than in the partial image 720 also due to the higher resolution of an AFM with respect to the AIMS®.

In addition to an AFM different types of scanning probe microscopes can be used, as for example a scanning tunneling microscope, a magnetic force microscope, an optical near-field microscope and/or an acoustical scanning near-field microscope. It is also possible to use a combination of several scanning probe microscopes for scanning the defect 730.

The lower partial image 780 of FIG. 7 schematically shows a section of the EUV mask of the partial images 720 and 760 as it appears in the scan of the scanning electron microscope (SEM). The contrast between the multi-layer structure 735 and the edges of the absorber lines 785 is clearly seen in the SEM image. Furthermore, the mark 750 on the absorber line is clearly recognizable. The defect 730 or 740 is generally not or only very weakly visible in the SEM image due to the small height difference of its surface contour.

It is suitable to start the analysis of a defect 730 with the measurement of an aerial image and to generate in the next step at least one mark 750 in order to facilitate the further analysis of the defect 735. However, the sequence of the subsequent SEM and AFM analysis can be freely chosen.

The image data of the partial images 720, 760 and 780 are then mutually aligned relative to each other so that their pixels have a one-to-one (1:1) correspondence. This is achieved by adapting the scales of the individual pixels and/or by compensating deviations with respect to the at least one mark 750. Thus, it is possible to obtain a maximum of information with respect to the defect 730, 740 and its localization on the EUV mask 710 from the combination of the three different image data.

Generally, an electron beam is used in combination with an etching gas or a precursor gas for correcting the defect 730, 740. The mark 750 allows in combination with a pixel by pixel 1:1 correspondence of the image data of the partial images 720, 760 and 780 of FIG. 7 an exact guiding of the electron beam during the defect correction or the defect removal, although the defect 730, 740 is not or only unclearly visible in the SEM image.

Alternatively to an electron beam, an ion beam can also be used for scanning a region around the defect 730 identified in the partial image 720. Generally, the focus depth of an ion beam is also not sufficient to represent the flat surface contour of the defect 730, 740. Moreover, it is also possible to use an ion beam instead of an electron beam in combination with suitable etching gases or precursor gases for the removal of the defect 730, 740.

In the example presented in FIG. 7, the defect is a buried defect. If the defect is an absorber defect, the analysis of the defect can be done as described above. Alternatively, the defect analysis can also be interrupted after the evaluation of the AIMS image (upper partial image 720), and the absorber defect can be corrected by using the image data of the aerial image.

The flow diagram 800 of FIG. 8 briefly summarizes the process of the defect analysis. After the beginning at 810, the surface of an EUV mask is measured with an AIMS® at step 820. In the next step 830, at least one mark 750 is generated close to the identified defect 720, for example with the aid of a mask repairing device. At step 840, the region around the defect 720 is scanned via an AFM in order to obtain a precise contour of the surface of the defect 740. At step 860, the parameters of a defect model are determined on the basis of the determined and respectively combined image data, and the localization of the defect model with respect to the mark 750 is determined. Details of the last step are in the following explained in more detail.

Most of the defects 730, 740 visible on a wafer have a cylinder symmetry or can be modeled in good approximation by a model having cylinder symmetry. Complex two-dimensional (2D) surface contours of buried defects are exceptions. The reason for this may be that manufacturing methods and polishing methods of the mask substrates mainly generate in combination with the growth process of the multi-layer structure 735 round surface contours of buried defects 730, 740.

The multi-layer structure 735 is deposited on the entire EUV mask 710 in one process step. After the growth process of the multi-layer structure has been adjusted, all defects 730, 740 should have similar profiles on the surface of the multi-layer structure 735, since they are caused by the processing of the mask substrate and/or the deposition process of the multi-layer structure 735.

A defect visible on an exposed wafer has often a certain height or depth of approximately 3.5 nm. This corresponds essentially to a quarter of the actinic or EUV wavelength of 13.5 nm. This height difference is the reason that the radiation reflected from the defect 730, 740 has essentially a phase shift of $+\pi$ compared to radiation which is reflected from non-distorted regions of the multi-layer structure 735 of the EUV mask 710. The applicant has found out that defects which are visible on a wafer have a height (depth) or an arching (depression) at the surface of the multi-layer structure of approximately 2 nm to approximately 6 nm. Moreover, defects 730, 740 visible at a wafer exposure have a half width (FWHM, full width half maximum) of about 40 nm to 80 nm. Defects which are much flatter are only poorly visible in an aerial image 720 and defects which have a much larger lateral extension cannot be removed by compensation via a "compensational repair".

Visible defects which have to be repaired and which are accessible to a defect removal are according to the above explanations generally statically distributed about a common height (or depth) and a common half width. Therefore, a model is defined for the defect or a defect model for a reference defect that has a cylindrical Gaussian profile. In case of an arching of the surface of the multi-layer structure 735 or of a bump defect, the parameters of this reference defect model can for example be fixed with a height $h_0=3.5$ nm and a half width of $w_0=50$ nm.

The parameters of the defect model of a measured defect 730, 740 can be selected as desired either by its absolute height h and half width w, or by its deviation with respect to the reference defect model, i.e. by the parameter $\Delta h = h - h_0$ and $\Delta w = w - w_0$.

The defect 730, 740 is completely described within the framework of the explained defect model by specifying the parameters h and w as well as the position of the defect 730, 740.

The diagrams 900 of FIG. 9 schematically illustrate the parameters of the repairing form which is used to repair the defect 730, 740. The partial image of FIG. 9 shows the surface contour 910 of the defect 740 which has been determined via an AFM. In all partial images of FIG. 9 the mark 750 is not indicated.

The partial image B presents the top view of the defect model 920. As explained above the defect model 920 is characterized by the height h and the half width w. The parameters describing the position of the defect model 920 with respect to the mark 750 are also omitted in the partial image B.

The partial image C shows the half width w of the surface contour 910 of the defect 730, 740 described by the defect model 920 in comparison to a reference defect described by the reference defect 930 with the reference parameters $h_0$ and $w_0$.

In the example of FIG. 9, the reference defect model 930 is arranged in the vertical symmetry axis 935 between two absorber lines 945. The distance of the defect model 920 from the vertical symmetry axis 935 is indicated by x in the example of the partial image C.

According to the explained defect model 920 or the reference defect model 930, the preferred repairing form is a cycle. As can be seen from the partial image 720 of FIG. 7, the diffraction limitation of the AIMS® imaging system has the effect of a low pass filter and eliminates higher spatial frequencies of the defect 730, 740. In case that the circular repairing form is not sufficiently flexible, it can be extended by introducing a second axis.

The repairing form has to be selected such that it optimally fulfills the following constrains:

The critical dimension (CD) has to be obtained in the focus.

The process window of the focus range within which the CD is reached has to be optimized.

When determining the repairing form the design rules have to be fulfilled so that a mask repairing system can perform the correction.

For the reference defect model 930 the repairing form 940 has only one single parameter which is the radius or the diameter $D_o$. The parameter $D_o$ depends on the absorber structure used for the EUV mask. The partial image D of FIG. 9 schematically represents this situation.

Two further parameters are necessary in order to describe the position of the shifted reference defect relative to the mark 750: $\vec{x}_{def} = (x_{def}, y_{def})$. In the specific line space pattern of FIG. 9 having a symmetry line 935 reduces to two-dimensional vector $\vec{x}_{def} = (x_{def}, y_{def})$ to a scalar quantity: $x_{def}$. In order to keep the discussion simple, in the following the principle is illustrated at the specific absorber pattern arrangement indicated in FIG. 9.

During a wafer exposure, it has to be considered that the effect of the buried defect 730, 740 depends on the distance of the defect from the absorber lines 945. Defects which are arranged on the vertical symmetry line 935 between two absorber lines 945 cause larger imaging errors on an exposed wafer than defects which are arranged close to an absorber line 945 or which even partially project into an absorber line 945. Thus, the repairing form which indicates the amount of the changes of the absorber structure which are necessary for the defect removal depend on the position of the defect 730. The repairing form 940 takes this fact by two further parameters $\alpha$ and $\beta$ into account which modify the parameters of the defect model with respect to the relative position of the defect 730 to the vertical symmetry axis 935. The diameter of the repairing form model $D_{rep}$ is in the explained approximation of the following form:

$$D_{rep} = D_0(A.S.) + \alpha \cdot \Delta h + \beta \cdot \Delta w + \gamma \cdot x_{def} \quad (1)$$

$$= D_0(A.S.)\left(1 + \frac{\alpha \cdot \Delta h}{D_0(A.S.)} + \frac{\beta \cdot \Delta w}{D_0(A.S.)} + \frac{\gamma \cdot x_{def}}{D_0(A.S.)}\right)$$

A.S. is the absorber structure and takes into account that the diameter $D_0$ of the repairing form depends on the absorber structure of the EUV mask 710. The later form of equation (1) reveals the perturbation theoretical approach of the repairing form.

The distance of the center of the repairing form $\vec{x}_{rep}(x_{rep}, y_{rep})$ to the mark 750 is related with the distance of the center or with the center of gravity of the defect 730 by the equation $$\vec{x} = \frac{\vec{x}_{def}}{\delta} \quad (2)$$

For the arrangement of FIG. 9 having the symmetry line 935 equation (2) reduces to the scalar form:

$$x_{rep} = \frac{x_{def}}{\delta} \quad (3)$$

The partial image E of FIG. 9 shows the repairing form 950 which is adapted with respect to the repairing form 940 of the partial image D according to equation (1). On the one hand, the diameter of the adjusted repairing form 950 is larger than the diameter of the repairing form 940 for correcting the defect which is described by the reference defect model. This is primarily a consequence of the effect that the defect which is described by the defect model 920 is larger than the defect on which the reference defect model 930 is based. On the other hand, the repairing form 950 is shifted from the symmetry axis 935. Thereby, the repairing form 950 follows the shift of the defect 910 or of the defect model 920.

The partial image F of FIG. 9 illustrates the absorber structure elements or the absorber lines 945 after the defect 910 has been corrected via the defect model 920 by applying the repairing form 950 onto the defect 910. A mask repairing device as for example a MeRiT™ system of the Carl Zeiss company is used for the modification of the absorber lines 945.

The aerial image of the repaired position of the EUV mask 710 can again be measured with an AIMS® in order to check the success of the repair. If necessary, a remaining defect can be corrected in a second repairing step if it would still lead to a non-tolerable CD variation in the aerial image or on the exposed wafer. Prior to the second repair, the parameters of the repairing forms are adapted to the defect which is still remaining Alternatively, the repairing form 950 can be extended by a further parameter in order to remove the remaining defect.

Buried defects 730 have both amplitude errors and phase errors. The "compensational repair" of FIG. 9 has no influence on the phase of the reflected light, so that the described compensation leads to a decrease of the process window for the allowable focus range. In the example represented in FIG. 9, absorber material is removed around the defect for the correction of a bump defect. Thus, after the compensation, the area is increased from which light is reflected to the desired position (via diffraction effects) compared to the initial state. The portion of the area which is free from a phase defect to the area whose light is distorted by a phase area is increased by the repairing process of the buried defect 730. This can lead to the fact that the phase error of the buried defect 730 is less visible after the compensation compared to the initial state.

In the following, the determination of the parameters of the repairing form 950 is explained. Prior to the defect correction, the parameters $\alpha$, $\beta$, $\gamma$ and $\delta$ can be optimized by a numerical optical simulation. For this purpose, commercial software programs, as for example, panoramic, DrLITHO or S-Litho can be used. The parameters for the repairing form can be different for bump defects and for pit defects.

Based on FIGS. 10 to 12 the determination of the parameters $D_0$, $\alpha$ and $\beta$ is exemplarily explained.

The diagrams 1000 of FIG. 10 describe a bump defect (upper partial image 1010), its effect on the CD, i.e. the CD variation induced by the bump defect (lower partial image 1090), and the various correction measures for the defect in the middle partial images 1070. The upper partial image 1010 shows a bump defect 1040 on a substrate 1020. The bump defect 1040 propagates as defect 1035 through the multi-layer structure 1030. The bump defect 1030 leads to a small arching 1045 at the surface of the multi-layer structure 1040. In the example of FIG. 10, the bump defect 1030 is arranged on the symmetry line between two absorber lines 1045, i.e. it is arranged on the reference position.

In the aerial image presented in the lower partial image 1090, the bump defect 1030 can be seen in a CD variation of the absorber lines 1095. The two middle partial images 1070 indicate various diameters 1075 and 1080 of the repairing form of equation (1), wherein all parameters are set to zero except the diameter $D_0$.

FIG. 11 represents the simulated CD change for a line space pattern of 32 nm as a function of the diameter $D_0$ of the repairing form model (upper abscissa) for the EUV mask 710. The lower horizontal axis indicates the change of the radius $\Delta r$ of the repairing form with respect to a diameter of 128 nm. This means the lower and the upper horizontal axis are related via the equation:

$$D_0 = 128 \text{ nm} + 2 \cdot \Delta r \quad (4)$$

Thereby, it has to be taken into account that the illumination system of an EUV lithography system images the structural elements of the mask 710 diminished by a scale of 1:4. The simulation data of FIG. 11 reveal that in the focus a repairing form having a diameter $D_0 = 194$ nm corrects in focus the defect 1030 to the nominal CD of 32 nm. Furthermore the slope of the straight line in FIG. 11 is given by:

$$\frac{\Delta CD}{\Delta r} = 0.46.$$

This means that a change of the radius of the repairing form model of 2 nm results in a CD change of about 1 nm around the target value of the CD.

In the upper partial image FIG. 12 shows a change on the CD of the wafer as a function of the height of the bump defect 1030 of FIG. 10. The simulated defect has a half width of 110 nm. From the slope of the simulated curve it can be determined that a height change of 1 nm results in a decrease of the CD of 2.6 nm in the region of a height change from 2 nm to 5 nm of the defect 1030.

The lower partial image of FIG. 12 represents a simulation of the CD change as a function of the half width of the defect 1030. In the focus, the height of the defect 1030 is uniquely 4 nm for the presented simulation curve in focus. In the focus, in the range of a half width from 70 nm to approximately 160 nm, the slope of the curve determines a decrease of the CD of 0.18 nm per 1 nm increase of the half width of the defect 1030.

FIGS. 11 and 12 make clear that the parameters $D_0$, $\alpha$ and $\beta$ of the repairing form model 950 of equation (1) can be determined or optimized via simulation. In the example of FIGS. 10 to 12 the parameters of the repairing form of the equation (1) result in $$D_{rep} = 194 \text{ nm} + 10.4 \cdot \Delta h + 0.72 \cdot \Delta w$$

for a 32 nm line space pattern on the wafer, and when considering the 1:4 reduction of the mask structures.

In the simulations of FIGS. 10 to 12 for determining the parameters $D_0$, $\alpha_0$ and $\beta_0$, the defect is always located on the symmetry line 935 between two absorber lines 1045. Using further simulations the change of the effect of a buried defect 1030 with respect to absorber lines can be simulated. Thereby, the parameter $\gamma$ of equation (1) can be determined as a function of the position of the defect.

If the defect is a bump defect as it is represented in FIGS. 9 and 10, which is compensated by the removal of absorber material, it has additionally to be considered that the effective repairing form generated by the etching is larger than the calculated repairing form due to scattering processes of the particle beam, which is preferably an electron beam. Thus, in order to obtain the correct diameter of the repairing form, the diameter of the repairing form of equation (1) has to be reduced by a constant value:

$$D_{etch} = D_{rep} - C \quad (5)$$

wherein the constant C can for example be in the range of 20 nm.

Alternatively to the above explained determination of the parameters of the repairing form by simulation, series of programmed defects can be generated and the parameters of the repairing form can be determined from aerial images and/or from exposed wafers by comparison with defect free EUV masks.

The repairing form with specified parameters is used for the compensation of a buried defect. For this purpose, material is removed from the absorber structure elements or from the absorber lines for a bump defect. For this process, preferably an electron beam and an etching gas are used (for example xenon difluoride ($XeF_2$)) or a combination of etching gases. The electron beam is guided during the defect repair with the help of the mark 750.

Analogously to bump defects, generally pit defects lead to a local reduction of the reflection of the optical element and are therefore similarly corrected as bump defects by a local material removal from neighboring elements of the absorber structure, as this process is predetermined by a respective repairing form. However, a situation may also occur in which the EUV mask locally has a too large reflection coefficient. This may be caused by a local defect of the absorber structure and/or a defect buried in the multi-layer structure. These defects are corrected by selectively depositing additional absorber material according to the determined repairing form to the absorber structure element surrounding the defect. Preferably this defect compensation also occurs by using an electron beam and via for example chromium, tantalum and/or silicon based precursor gases, as for example chromium hexacarbonyl ($Cr(CO)_6$), tantalum pentaethyloxide ($Ta(OEt)_5$) or tetraethylorthosilicate ("TEOS") ($Si(OEt)_4$).

After the defect has been compensated by using a parameterized repairing form the repaired position of the EUV mask is optically measured. Preferably an AIMS® is used for this measurement. Due to the assumptions of the repairing form it may occur that the CD does not reach the predetermined specification after a first repairing step. This means that where necessary a further repairing step has to be used in order to compensate the defect remaining after the first repairing step so that the CD variation resulting from the remaining defect can no longer violate a predetermined CD specification.

For the second repairing step, the parameters of the repairing form are adapted in particular the diameter $D_0$. If it is necessary to remove more absorber material, the circle of the repairing form is selected to be larger, or if, on the other hand, too much absorber material has been removed, absorber material is deposited at the respective positions.

If a systematic deviation is observed during the defect compensation based on optical measurements a non-circular repairing form may be introduced, for example by removing absorber material only from one side of the defect. To this end the parameters of the available repairing form may newly be calibrated. Alternatively, the equation of the repairing form may be extended in order to better compensate defects which significantly depart from a circular shape.

The flow diagram 1300 of FIG. 13 summarizes the sequence of the determination of a repairing form for an identified buried defect 1030. After the beginning at 1310, a defect model 920 for the defect 1030 is determined by comparison with a reference defect model at a first step 1320. In a second step 1330, parameters of the repairing form which have been in advanced optimized by simulation are loaded from a memory. Alternatively, the parameters can be optimized by simulation during the sequence of the method. Finally, the repairing form is determined at 1340 by inserting the defect model and the optimized parameters into the repairing form, and the method ends at step 1350.

In the following, a second concept is presented for determining a repairing form for a buried defect. This concept is based on the surface contour of a buried defect measured via an AFM and aerial image measurements which are executed with an AIMS®. For this purpose, it is not only measured an aerial image in the focus, as is explained above, but rather a stack of aerial images through the focus is recorded, i.e. from a positive defocusing to a negative defocusing, in order to analyze the depth profile the identified defect. Then, the aerial image stack and the surface contour are compared with the aerial image stack and the surface contours of defects which are stored in a list or in a library. Apart from a surface contour and an aerial image stack, each defect stored in the library is also associated with a repairing form. The repairing form of the stored defect which surface contour and aerial image stack is closest to the surface contour and the aerial image stack of the identified defect is used for the compensation of the buried defect.

For example, a library of stored defects can be set up by starting from a reference defect. For example, this can be a bump defect 1030 with a height of 3 nm and a half width of 52 nm. This data refers to the defect 1030 itself and not to its contour on the surface of the multi-layer structure 1040. For the propagation or the transmission of the buried defect 1030 in the multi-layer structure 1040, three different propagation models are now assumed: (a) 1:1 Propagation, i.e. the surface contour 1054 has the same dimensions as the buried defects 1030. (b) 1:3 Propagation, i.e. the height of the defect 1030 is three times larger than the arching of its surface contour on the surface 1045 of the multi-layer structure 1040. (c) Propagation of the buried defect 1030 according to a smoothing equation, i.e. the height and the half width of the defect 1030 follow a predetermined mathematical pattern which can be explained by the growth conditions of the multi-layer structure 1040. The article already mentioned in the second section "Localized defects in multi-layer coatings" of D. G. Stearns et al., in Thin Film Solids 446 (2004), pages 37-49 discusses these growth models for the multi-layer structure 1040. The aerial image stacks measured through the focus provide a hint whether these propagation models will well reproduce the identified defect 1030.

The respective effects of the defect on the CD are calculated by simulation of the above mentioned reference defect using the three above mentioned different propagation conditions of the defect 1030 in the multi-layer structure 1040. In parallel for each propagation of the defect 1030 through the multi-layer structure 1040, the best repairing form is simulated and stored in a library together with the defect 1030.

The library or the data base of possible defects is now set up by calculating for example the height of a reference bump defect in steps of 0.5 nm for the height ranging from 2 nm-6 nm as well as for example a variation of its half width from 30 nm to 80 nm with a step width of 10 nm. The simulation is performed for each defect for the above indicated three propagation models. This simulation process is repeated for pit defects with the same or with a similar step width. The library generated in this way comprises approximately 400 different defect entries. If necessary, the boundaries and the step width of the simulated defects can be adapted to the buried defects of various EUV masks.

The above described simulations of defects are also performed for mask substrates 1020 which have a corresponding multi-layer structure 1040, but which do not have an absorber structure. The absorber structure is correlated as a transmission matrix with the respective defect. Thus, a near field image or a diffraction spectrum of the defect is generated which can be filtered by the illumination system. Thereby, the absorber pattern can be of arbitrary complexity. Analogously to the above described first concept, the repairing of the buried defect can also be performed in an iterative process when using the second concept.

The flow diagram 1400 of FIG. 14 summarizes the sequence of the determination of a repairing form for an identified buried defect 1030 according to the second concept. After the beginning at 1410, the determination of a surface contour and of an aerial image stack of the defect 1030 through the focus occurs at a first step 1420. In the second step 1430, the surface contour of the buried defect 1030 is determined via an AFM. At step 1440, these quantities of the identified defect 1030 are compared with the respective quantities of the stored defects. Finally at step 1450, the repairing form of the stored defect is selected whose surface contour and whose aerial image stack is closest to the surface contour determined at step 1430 and to the aerial image stack of the identified defect 1030 determined at step 1420. The method ends at step 1460.

Finally, the flow chart 1500 of FIG. 15 presents a further concept which can be used to determine the parameters of a repairing form. After the beginning at 1505, an aerial image of a defect is determined preferably via an AIMS® at step 1510. At step 1515, the surface contour of the defect identified at step 1510 is for example scanned with an AFM. In the next step 1520, the defective area of the EUV mask is scanned preferably with an SEM. Then, at step 1525, the data of the three mentioned data sources are combined in an image, and the model of the identified defect is determined.

At step 1530, the initial parameters for a repairing form are selected. For example, these parameters can be the parameters compensating a defect which is described by the reference defect model 930. With the repairing form determined in this way, an aerial image of the corrected defect is calculated via a simulation at step 1535. At step 1545, the simulated aerial image is compared with the aerial image of a defect free range of the EUV mask 710. For this purpose, the target aerial image denotes an aerial image of a defect free mask region. The compensated area of the EUV mask should be as close as possible to the target aerial image. At decision block 1550, it is decided whether the simulated aerial image fulfills the CD specification predetermined by the target aerial image. If this is true, the present parameters of the repairing form are used for the compensation of the defect 1030, and the method ends at block 1560. If the aerial image simulated with the present parameters of the repairing form exceeds a predetermined allowable CD variation, the parameters of the preparing form are changed at step 1555, and a new aerial image of the defect is generated, wherein the defect has been compensated in a simulation process with the modified parameters. The optimization process for the parameters of the repairing form is continued until the simulated repairing results in a CD variation which fulfills a predetermined specification.

The determined repairing form is used with the optimized parameters for compensating the buried defect 1030.

The invention claimed is:

1. An apparatus, comprising:
an ultra-violet radiation source configured to determine first data of a defect of an optical element for an extreme ultra-violet wavelength range, the optical element comprising a substrate and a multi-layer structure;
a scanning probe microscope configured to determine second data of the defect;
a scanning particle microscope configured to determine third data of the defect;
a combining unit adapted to combine the first data, the second data and the third data, and to transform at least one member selected from the group consisting of the first data, the second data and the third data so that a pixel of the first data is associated with a pixel of the second data and a pixel of the third data, and
a device configured to generate a mark by locally depositing material on at least one element selected from the group consisting of the multi-layer structure and an absorber structure of the optical element; and/or a device configured to generate a mark by etching a local depression into an absorber structure of the optical element,
wherein the combining unit is configured to compensate deviations with respect to at least one member selected from the group consisting of the mark, a scale of the first data, a scale of the second data, a scale of the third data.

2. The apparatus of claim 1, wherein:
the scanning probe microscope comprises at least one member selected from the group consisting of a scanning force microscope, a scanning tunneling microscope, a magnetic field force microscope, an optical near-field microscope, and an acoustic scanning near-filed microscope; and
the scanning particle microscope comprises at least one member selected from the group consisting of a scanning electron microscope, a focused ion-beam microscope and an interferometer.

3. The apparatus of claim 1, wherein the optical element comprises a photolithographic mask.

4. The apparatus of claim 1, wherein the combining unit is configured to adapt parameters of a model for the defect to the combined first, second and third data.

5. The apparatus of claim 4, wherein the model comprises a rotationally symmetrical Gaussian profile which is parameterized by a height and a half-width.

6. The apparatus of claim 4, wherein the model comprises at least two parameters with respect to a position of the defect relative to a mark.

7. A method of analyzing a defect of an optical element for an extreme ultra-violet wavelength range, the optical element comprising a substrate and a multi-layer structure, the method comprising:
determining first data by exposing the defect to ultra-violet radiation;
determining second data by scanning the defect with a scanning probe microscope;
determining third data by scanning the defect with a scanning particle microscope;
combining the first, the second and the third data;
generating a mark by locally depositing material on at least one element selected from the group consisting of the multi-layer structure and an absorber structure of the optical element; and/or
generating a mark by etching a local depression into an absorber structure of the optical element;
wherein combining the first, the second and the third data comprises compensating deviations with respect to at least one member selected from the group consisting of the mark, a scale of the first data, a scale of the second data, a scale of the third data; and
wherein combining the first, the second, and the third data further comprises transforming at least one member selected from the group consisting of the first data, the second data and the third data so that each pixel of the first data is associated with a pixel of the second data and a pixel of the third data.

8. The method according to claim 7, further comprising using the scanning particle microscope to at least partially compensate the defect.

9. The method according to claim 7, wherein exposing the defect to ultra-violet radiation further comprises recording an aerial image of the defect and/or exposing a wafer.

10. The method according to claim 9, wherein recording an aerial image of the defect comprises recording an aerial image in a focus and/or recording an aerial image stack by changing a focus relative to the optical element for the extreme ultra-violet wavelength range.

11. The method according to claim 7, wherein:
the scanning probe microscope comprises at least one member selected from the group consisting of a scanning force microscope, a scanning tunneling microscope, a magnetic field force microscope, an optical near-field microscope, and an acoustic scanning near-filed microscope; and the scanning particle microscope comprises at least one member selected from the group consisting of a scanning electron microscope, a focused ion-beam microscope and an interferometer.

12. The method according to claim 7, wherein the defect comprises a buried defect arranged in the multi-layer structure and/or in the substrate.

13. The method according to claim 7, further comprising adapting parameters of a model for the defect to the combined first, second and third data.

14. The method according to claim 13, wherein the model comprises a rotationally symmetrical Gaussian profile which is parameterized by a height and a half-width.

15. The method of claim 13, wherein the model comprises at least two parameters with respect to a position of the defect relative to a mark.

16. A method of analyzing a defect of an optical element for an extreme ultra-violet wavelength range, the optical element comprising a substrate and a multi-layer structure, the method comprising:

determining first data by exposing the defect to ultra-violet radiation;
determining second data by scanning the defect with a scanning probe microscope;
determining third data by scanning the defect with a scanning particle microscope;
combining the first, the second and the third data; and
adapting parameters of a model for the defect to the combined first, second and third data;
wherein the model comprises a rotationally symmetrical Gaussian profile which is parameterized by a height and a half-width.

17. The method according to claim 16, further comprising: a) generating a mark by locally depositing material on at least one element selected from the group consisting of the multi-layer structure and an absorber structure of the optical element; and/or b) generating a mark by etching a local depression into an absorber structure of the optical element.

18. The method according to claim 17, further comprising using the scanning particle microscope to generate the mark.

19. The method according to claim 17, wherein combining the first, the second and the third data comprises compensating deviations with respect to at least one member selected from the group consisting of the mark, a scale of the first data, a scale of the second data, a scale of the third data.

20. The method according to claim 19, wherein combining the first, the second, and the third data further comprises transforming at least one member selected from the group consisting of the first data, the second data and the third data so that each pixel of the first data is associated with a pixel of the second data and a pixel of the third data.

21. An apparatus, comprising:

an ultra-violet radiation source configured to determine first data of a defect of an optical element for an extreme ultra-violet wavelength range, the optical element comprising a substrate and a multi-layer structure;
a scanning probe microscope configured to determine second data of the defect;
a scanning particle microscope configured to determine third data of the defect;
a combining unit configured to combine the first, the second and the third data, and adapt parameters of a model for the defect to the combined first, second and third data, wherein the model comprises a rotationally symmetrical Gaussian profile which is parameterized by a height and a half-width.

22. The apparatus of claim 21, wherein:

the scanning probe microscope comprises at least one member selected from the group consisting of a scanning force microscope, a scanning tunneling microscope, a magnetic field force microscope, an optical near-field microscope, and an acoustic scanning near-filed microscope; and
the scanning particle microscope comprises at least one member selected from the group consisting of a scanning electron microscope, a focused ion-beam microscope and an interferometer.

23. The apparatus of claim 21, wherein the optical element comprises a photolithographic mask.

24. The apparatus of claim 21, wherein the defect comprises a buried defect arranged in the multi-layer structure and/or in the substrate.

25. The apparatus of claim 21, further comprising a device configured to record an aerial image of the defect and/or exposing a wafer.

* * * * *

UNITED STATES PATENT AND TRADEMARK OFFICE
CERTIFICATE OF CORRECTION

PATENT NO. : 10,060,947 B2
APPLICATION NO. : 14/137731
DATED : August 28, 2018
INVENTOR(S) : Michael Budach et al.

It is certified that error appears in the above-identified patent and that said Letters Patent is hereby corrected as shown below:

On the Title Page

Item (56), Column 2, Other Publications, Line 4, delete "2010" and insert -- 21010 --.

Item (57), Abstract, Line 9, delete "com-bining" and insert -- combining --.

In the Specification

Column 11, Line 53, delete "eching" and insert -- etching --.

Column 12, Line 58-59, delete "dicobaltoctocarbonyl" and insert -- dicobaltoctacarbonyl --.

Column 14, Line 44, delete "+Π" and insert -- ±π --.

Column 16, Line 29-32, delete "$\vec{x} = \frac{\vec{x}_{def}}{\delta}$" and insert -- $\vec{x}_{rep} = \frac{\vec{x}_{def}}{\delta}$ --.

Column 17, Line 1, after "remaining" insert -- . --.

In the Claims

Column 22, Line 10, in Claim 2, delete "filed" and insert -- field --.

Column 23, Line 4, in Claim 11, delete "filed" and insert -- field --.

Claim 24, Line 33, in Claim 22, delete "filed" and insert -- field --.

Signed and Sealed this
Sixteenth Day of April, 2019

Andrei Iancu
*Director of the United States Patent and Trademark Office*